US012771176B1

(12) United States Patent
Hussein

(10) Patent No.: US 12,771,176 B1
(45) Date of Patent: Oct. 20, 2026

(54) SYSTEM AND METHOD FOR WIRELESS BATTERY CHARGING

(71) Applicant: PRINCE MOHAMMAD BIN FAHD UNIVERSITY, Dhahran (SA)

(72) Inventor: Ala A. Hussein, Dhahran (SA)

(73) Assignee: PRINCE MOHAMMAD BIN FAHD UNIVERSITY, Dhahran (SA)

( * ) Notice: Subject to any disclaimer, the term of this patent is extended or adjusted under 35 U.S.C. 154(b) by 0 days.

(21) Appl. No.: 19/561,192

(22) Filed: Mar. 9, 2026

(51) Int. Cl.
*H02J 50/12* (2016.01)
*G01R 19/10* (2006.01)

(52) U.S. Cl.
CPC .............. *H02J 50/12* (2016.02); *G01R 19/10* (2013.01)

(58) Field of Classification Search
CPC ................................. H02J 50/12; G10R 19/10
See application file for complete search history.

(56) References Cited

U.S. PATENT DOCUMENTS

2022/0209587 A1* 6/2022 Kavimandan ......... B60L 53/122

FOREIGN PATENT DOCUMENTS

CN 116073529 A 5/2023
CN 116846095 A 10/2023

OTHER PUBLICATIONS

Raghu Narayanan, "Wireless power charging coil changing considerations", Wurth Elektronik, Feb. 23, 2015, 9 Pages.
J. Franklin, et al., "Advanced Step Density Modulation Technique to Reduce Current Ripples in High-Frequency Inverter for WPT EV Charging Systems", IEEE Access, vol. 13, 2025, pp. 39473-39488, 16 Pages.
Emir Sulejmani, et al., "EMC of Inductive Automotive Charging Systems According to Standard SAE J2954", Vehicles 2023, vol. 5, Issue 4, pp. 1532-1552, 21 Pages.

* cited by examiner

*Primary Examiner* — Robert Grant
(74) *Attorney, Agent, or Firm* — Oblon, McClelland, Maier & Neustadt, L.L.P.

(57) ABSTRACT

A wireless battery charging system and method including a frequency source to generate an alternating current at a preset resonant frequency, a primary-side rectifier to convert the alternating current to a direct current, and a high-frequency inverter to convert the direct current to another alternating current. A primary transformer generates an alternating magnetic field, a secondary transformer receives the alternating magnetic field and generates a stepped-down alternating current, and a feedback microcontroller controls the alternating current frequency to maintain a stable voltage at the load. The feedback microcontroller compares the current and delayed voltage at the load to determine the error and updates the frequency to compensate for changes in the coupling factor between the primary and secondary transformers.

20 Claims, 12 Drawing Sheets

SYSTEM AND METHOD FOR WIRELESS BATTERY CHARGING

CROSS REFERENCE TO RELATED APPLICATIONS

The present application is related to U.S. application Ser. No. 19/531,959 titled "System and Method for Wireless Battery Charging", filed on Feb. 6, 2026, which is incorporated herein by reference in its entirety.

BACKGROUND

Technical Field

The present disclosure is directed to wireless charging, and more specifically to a system and method for wireless power transfer to a rechargeable battery.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Wireless power transfer systems commonly employ magnetically coupled transmitting and receiving coils to deliver energy from a power source to a load, with compensation capacitors connected to the coils to form resonant circuits that enhance power transfer efficiency. In conventional arrangements, the supply frequency is tuned to a resonant frequency determined by specific operating conditions, such as load characteristics, coil separation distance, and relative coil orientation or alignment, in order to maximize transferred power. However, the magnetic coupling between the coils is highly sensitive to variations in these parameters, and changes in the coupling coefficient can shift both the resonant frequency and the power delivered to the load. As a result, when a fixed operating frequency is used, deviations from the nominal alignment, orientation, or spacing of the coils can lead to a substantial reduction in transferred power, even for relatively small perturbations. These limitations highlight the shortcomings of fixed-frequency wireless power transfer systems and underscore the need for adaptive solutions that can track changes in resonant frequency to maintain efficient, reliable power delivery across varying operating conditions.

CN116846095A describes a voltage stabilization control for a multi-load wireless power transmission system, which achieves power distribution among different loads by switching a transmitting-coil-side compensation capacitor array C1 and a transmitting-coil-side compensation capacitor array C2, and realizes constant-voltage control at a load terminal by adjusting phase-shift angles $\alpha\mathbf{1}$ and $\alpha\mathbf{2}$ of a semi-active rectifier bridge according to a given voltage reference. However, this patent uses a DC input.

In another approach, EMC of Inductive Automotive Charging Systems, according to SAE J2954, outlines the fundamental principles of wireless power transfer (WPT) for electric vehicles with a particular emphasis on electromagnetic compatibility (EMC) considerations. The study investigates both conducted and radiated electromagnetic interference generated by a WPT system operating at a maximum input power of 3.6 kW. A frequency-tracking algorithm determines the optimal operating frequency under varying coil misalignment conditions, thereby ensuring stable system performance. The impedance characteristics and potential interference coupling paths are analyzed, revealing a strong dependence on the geometric configuration of the experimental setup. Conducted interference currents are measured and effectively mitigated through filtering techniques, demonstrating substantial attenuation of common-mode currents. Radiated magnetic field emissions are evaluated in relation to the limit values specified by relevant standards. Additionally, the EMC impact of the DC power supply cable connected to the inverter, which is not explicitly defined in the standard, is examined. The results highlight the importance of a standardized test configuration, as compliance with emission limits can vary significantly with different DC cable geometries.

Each of the aforementioned references addressed different aspects of wireless power transfer. While these references contributed to foundational strategies for wireless power transfer, existing systems remain highly sensitive to variations in coil alignment, orientation, and separation, leading to resonance drift and significant reductions in delivered power under fixed-frequency operation. Many solutions introduce additional circuit components, complex modulation schemes, or sophisticated control algorithms, which increase system cost, design complexity, and computational burden. Multi-load and voltage regulation methods are often tailored to specific operating conditions and lack robustness to variations in the coupling coefficient. Moreover, several approaches address both power regulation, harmonic mitigation, or EMC performance in isolation, without providing an integrated solution that ensures stable, efficient operation across varying coupling and installation conditions.

Accordingly, it is one object of the present disclosure to provide methods and systems for wireless power transfer that enable the system to determine and track the resonant frequency of the tuning network in a wireless power transfer setup under any operating condition. The system detects a voltage difference between a first voltage at the load and a second voltage at the load and determines an optimal operating frequency of the high-frequency inverter based on a comparison between the voltage difference and a predetermined error. Further, the system easily controls speed and accuracy by adjusting parameters.

SUMMARY

In an exemplary embodiment, a wireless battery charging system is described which includes a frequency source configured to generate a first alternating current at a preset resonant frequency, a primary-side rectifier coupled to the frequency source, wherein the primary-side rectifier is configured to convert the first alternating current at the preset resonance frequency to a direct current, a high-frequency inverter connected in parallel with the primary-side rectifier, wherein the high-frequency inverter is configured to convert the direct current to a second alternating current at an operating frequency, and a primary transformer connected in parallel with the high-frequency inverter, wherein the primary transformer is configured to receive the second alternating current at the operating frequency and generate an alternating magnetic field at the operating frequency, a secondary transformer configured to receive the alternating magnetic field and generate a stepped down alternating current at the operating frequency, a secondary-side rectifier connected in parallel with the secondary transformer, wherein the secondary-side rectifier is configured to receive the stepped down alternating current at the operating frequency and generate a stepped down direct current, a load connected in parallel with the secondary-side rectifier, wherein the load is configured to receive the stepped down direct current, a voltage sensor connected to the load, wherein the voltage sensor is configured to measure a voltage $V_k$ at the load at the load, and a feedback microcontroller connected between the voltage sensor and the high-frequency inverter, wherein the feedback microcontroller is configured to: determine a difference between a differential voltage $\Delta V_k$ and a delayed differential voltage $\Delta V_{k-1}$, compare an absolute value of the difference between the differential voltage $\Delta V_k$ and the delayed differential voltage $\Delta V_{k-1}$ to an error criterion ε, when the absolute value of the difference between the differential voltage $\Delta V_k$ and the delayed differential voltage $\Delta V_{k-1}$ is less than the error criterion ε, determine a frequency step size based on the difference between the differential voltage $\Delta V_k$ and the delayed differential voltage $\Delta V_{k-1}$, update the operating frequency with the frequency step size, and transmit the updated operating frequency to the high-frequency inverter.

In another exemplary embodiment, a method for wireless power transfer to a rechargeable battery is described, comprising: generating, by a frequency source, a first alternating current at a preset resonant frequency, connecting a primary-side rectifier to the frequency source, converting, by the primary-side rectifier, the first alternating current at the preset frequency to a direct current, converting, by a high-frequency inverter connected in parallel with the first rectifier, the direct current to a second alternating current at an operating frequency, and connecting a primary transformer in parallel with the high-frequency inverter, receiving, by the primary transformer, the second alternating current at the operating frequency, generating, by the primary transformer, an alternating magnetic field at the operating frequency, receiving, by a secondary transformer, the alternating magnetic field, generating, by a secondary transformer, a stepped down alternating current at the operating frequency, receiving, by a secondary-side rectifier connected in parallel with the secondary transformer, the stepped down alternating current at the operating frequency, generating, by the secondary-side rectifier, a stepped down direct current, connecting a load connected in parallel with the secondary-side rectifier, receiving, by the load, the stepped down direct current, measuring, by a voltage sensor connected to the load, a voltage $V_k$ at the load at the load, determining, by a feedback microcontroller connected between the voltage sensor and the high-frequency inverter, a difference between a differential voltage $\Delta V_k$ and a delayed differential voltage $\Delta V_{k-1}$, comparing, by the feedback microcontroller, an absolute value of the difference between the differential voltage $\Delta V_k$ and the delayed differential voltage $\Delta V_{k-1}$ to an error criterion ε, determining, by the feedback microcontroller, a frequency step size based on the difference between the differential voltage $\Delta V_k$ and the delayed differential voltage $\Delta V_{k-1}$, when the absolute value of the difference between the differential voltage $\Delta V_k$ and the delayed differential voltage $\Delta V_{k-1}$ is less than the error criterion ε, updating, by the feedback microcontroller, the operating frequency with the frequency step size, and transmitting, by the feedback microcontroller, the updated operating frequency to the high-frequency inverter.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
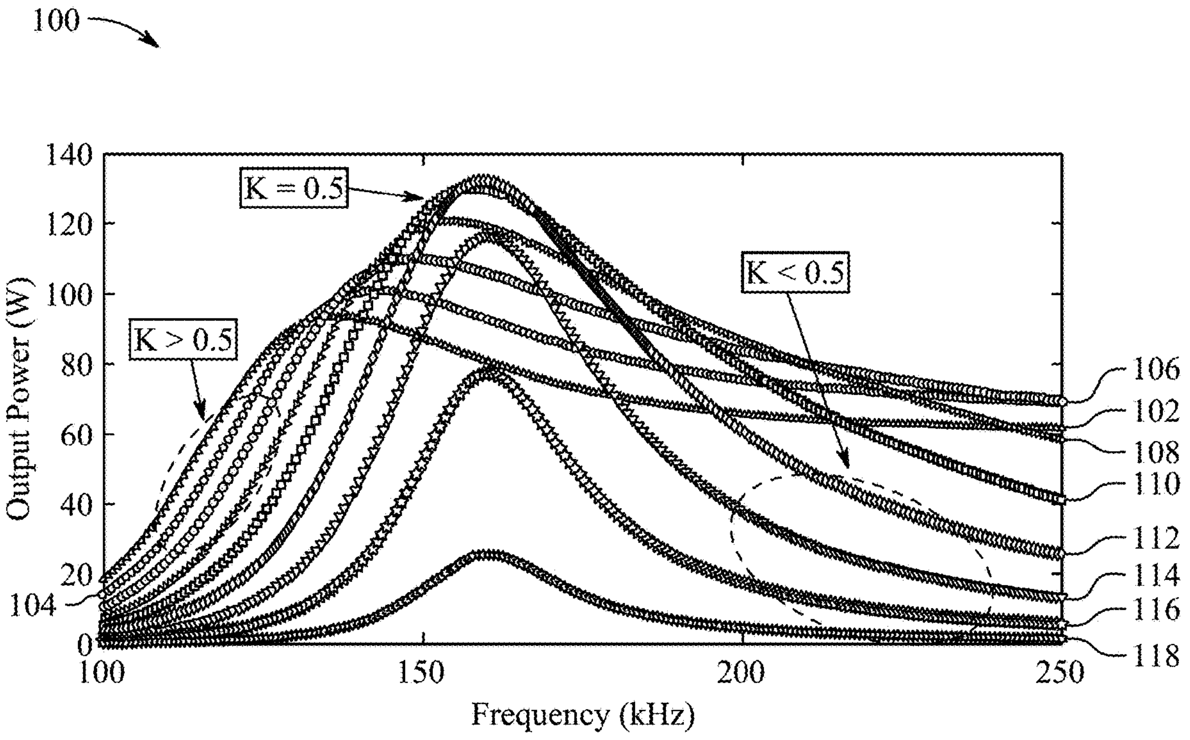
FIG. 1 is a graphical representation of output power versus resonant frequency at different coupling coefficient values, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to a system, device, and method for wireless battery charging system. The system includes a frequency source configured to generate an alternating current at a predetermined resonant frequency T, a primary-side rectification stage for converting the alternating current into direct current, and a high-frequency inverter that converts the direct current back into alternating current. The system further includes a primary transformer for producing an alternating magnetic field and a secondary transformer for inducing a reduced alternating current. A feedback microcontroller is configured to regulate the alternating current frequency so as to maintain a substantially constant load voltage. The feedback microcontroller evaluates a present current and a delayed load voltage to derive an error signal and correspondingly adjusts the operating frequency to compensate for variations in the coupling coefficient between the primary and secondary transformers.

FIG. 1 is a graphical representation 100 of output power versus resonant frequency at different coupling coefficient values. Wireless transfer of electrical power from a source to a load is achieved using a pair of magnetically coupled coils comprising a transmitting coil and a receiving coil. Each of the coils is electrically coupled to a corresponding tuning capacitor to form a resonant circuit, thereby enhancing magnetic coupling and improving power transfer efficiency. The excitation frequency of the power supply is adjusted to substantially match the resonant frequency of the coupled resonant circuits so as to maximize transferred power under a given operating condition, including at least one of a predetermined load impedance, an inter-coil separation distance, and a relative spatial orientation or alignment between the coils.

The magnetic coupling between the transmitting coil and the receiving coil is highly dependent on variations in the inter-coil distance and/or relative orientation, which directly affect a coupling coefficient (k). Variations in the coupling coefficient result in corresponding changes in the resonant frequency and in the amount of power delivered to the load.

As illustrated in FIG. 1, the effect of coupling coefficient variation on output power and resonant frequency for a wireless power transfer system employing a transmitting coil and a receiving coil, each having an inductance of approximately 1 μH and a series-connected tuning capacitor of approximately 1 μF, under a constant load condition, for coupling coefficient values ranging from about 0.1 to about 0.9. In an aspect, the coupling coefficient refers to a dimensionless parameter that quantifies the degree of magnetic coupling between a primary coil and a secondary coil, representing the fraction of magnetic flux generated by the primary coil that links the secondary coil of the transformer.

The graphical representation 100 shows the variation of the output power vs the frequency. The x-axis represents the frequency in kHz, and the y-axis represents the output power in watts (W). Curve 102 represents k=0.1, curve 104 represents k=0.2, curve 106 represents k=0.3, curve 108 represents k=0.4, curve 110 represents k=0.5, curve 112 represents k=0.6, curve 114 represents k=0.7, curve 116 represents k=0.8, and curve 118 represents k=0.9.

As illustrated in the FIG. 1, the resonant frequency of the wireless power transfer system varies as a function of the coupling coefficient between the transmitting coil and the receiving coil. The coupling coefficient is influenced by operating conditions, including, but not limited to, relative misalignment, angular orientation, and separation distance between the coils. Consequently, operating at a fixed excitation frequency results in detuning when these operating parameters deviate from nominal values, thereby causing a substantial reduction in the power delivered to the load.

The graphical representation 100 shows that even minor variations in coil alignment, orientation, or spacing can produce significant shifts in the resonant frequency and correspondingly large degradations in transferred power. Such behavior demonstrates the limitations of fixed-frequency operation and motivates the requirement for an adaptive wireless power transfer system to automatically detect variations in the coupling condition, dynamically track the resulting changes in resonant frequency, and adjust operating parameters in real time so as to maintain resonance and ensure maximum or near-maximum power delivery across a wide range of operating conditions.

Figure 2:
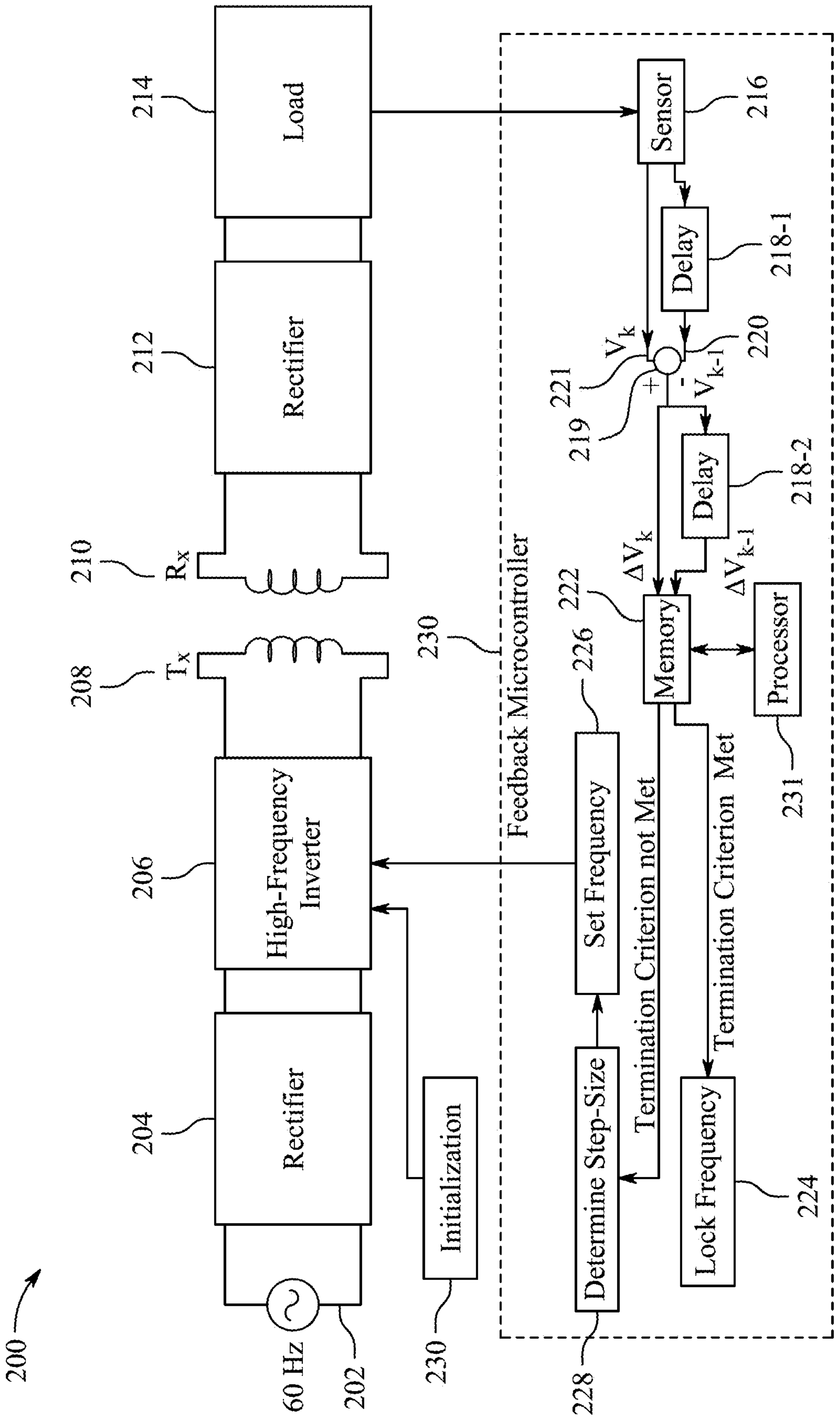
FIG. 2 is an exemplary schematic diagram of a wireless battery charging system with a feedback loop to control an operating frequency, according to certain embodiments.

FIG. 2 is an exemplary schematic diagram of a wireless battery charging system 200 with a feedback loop to control an operating frequency.

The wireless battery charging system 200 comprises an AC frequency source 202, a primary-side rectifier 204, a high-frequency inverter 206, a primary transformer 208, a secondary transformer 210, a secondary-side rectifier 212, a load 214, a voltage sensor 216, and a feedback microcontroller 230.

The AC frequency source 202 is configured to generate a first alternating current at a preset resonant frequency. In an aspect, the resonant frequency is the operating frequency at which the inductive reactance and capacitive reactance substantially cancel, thereby minimizing impedance and maximizing energy transfer within the system 200. The frequency source 202 generates the first alternating current at the preset resonant frequency, e.g., a standard 60 Hz alternating current (AC) signal.

The primary-side rectifier 204 is coupled to the frequency source 202. The primary-side rectifier 204 is configured to convert the first alternating current at the preset resonance frequency to a direct current. In an aspect, the frequency source 202 supplies the first alternating current to the primary-side rectifier 204. The primary-side rectifier 204 converts the first alternating current at the preset resonance to the direct current, which is suitable for subsequent processing. The rectification process provides a stable DC supply for the inverter stage.

The high-frequency inverter 206 is connected in parallel with the primary-side rectifier 204. In an aspect, the high-frequency inverter 206 is a high-frequency H-bridge inverter. The high-frequency inverter 206 is configured to convert the direct current to a second alternating current at an operating frequency. In an aspect, the direct current from the primary-side rectifier 204 is provided to the high-frequency inverter 206. The high-frequency inverter 206 converts the direct current to the second alternating current at the operating frequency. In an aspect, the high-frequency inverter 206 receives an input from the initialization block to convert the direct current to the second alternating current at the operating frequency.

The primary transformer Tx 208 is connected in parallel with the high-frequency inverter 206. The primary transformer Tx 208 is configured to receive the second alternating current at the operating frequency and generate an alternating magnetic field at the operating frequency. In an aspect, the second alternating current at the operating frequency from the high-frequency inverter 206 is provided to the primary transformer 208. The primary transformer 208 generates the alternating magnetic field at the operating frequency from the second alternating current.

The secondary transformer 210 is configured to receive the alternating magnetic field and generate a stepped-down alternating current at the operating frequency. In an aspect, the alternating magnetic field is fed from the primary transformer Tx 208 to the secondary transformer 210. The secondary transformer 210 generates the stepped-down alternating current at the operating frequency from the received alternating magnetic field.

The secondary-side rectifier 212 is connected in parallel with the secondary transformer 210. The secondary-side rectifier 212 is configured to receive the stepped down alternating current at the operating frequency and generate a stepped down direct current. In an aspect, the stepped down alternating current at the operating frequency is fed from the secondary transformer 210 to the secondary-side rectifier 212. The secondary-side rectifier 212 generates the stepped down direct current from the received stepped down alternating current at the operating frequency.

The load 214 is connected in parallel with the secondary-side rectifier 212. The load 214 is configured to receive the stepped down direct current. In an aspect, the load 214 comprises a rechargeable battery. In an aspect, the rechargeable battery is an energy storage element disposed on a receiver side of a wireless power transfer system and configured to store electrical energy derived from an inductively or magnetically coupled power signal, the battery being repeatedly chargeable through controlled charging cycles and operable to supply power to a connected load. The load 214, i.e., rechargeable battery, receives the stepped down direct current from the secondary-side rectifier 212.

The voltage sensor 216 is connected to the load 214. The voltage sensor 216 is configured to measure a voltage $V_k$ at the load 214. In an aspect, the voltage $V_k$ at the load 214 is measured at a first instant in time k.

The feedback microcontroller 230 is connected between the voltage sensor 216 and the high-frequency inverter 206. In an aspect, the feedback microcontroller 230 comprises a first delay component 218-1, a second delay component 218-2, a subtractor 219, a memory unit 222, and at least one processor.

The first delay component 218-1 is configured to receive the voltage $V_k$ from the voltage sensor 216 and generate a delayed voltage $V_{k-1}$. In an aspect, the output of the voltage sensor 216, i.e., the voltage $V_k$ is fed to the first delay component 218-1. The first delay component 218-1 introduces a controlled time delay to synchronize the voltage measurement.

The subtractor 219 has a positive input terminal 221 and a negative input terminal 220. The positive input terminal 221 is configured to receive the voltage $V_k$ from the voltage sensor 216. The negative input terminal 220 is configured to receive the delayed voltage $V_{k-1}$ from the first delay component 218-1. In an aspect, the delayed voltage $V_{k-1}$ is the voltage value corresponding to a previous sampling instant or time step (k−1), representing the voltage of the system at an earlier time relative to the current time step k.

The subtractor 219 is configured to generate a differential voltage $\Delta V_k$. The differential voltage is given by $\Delta V_k = V_k - V_{k-1}$. In an aspect, the differential voltage $\Delta V_k$ is the change in voltage between a current sampling instant k and a preceding sampling instant (k−1), i.e., $\Delta V_k = V_k - V_{k-1}$.

In an aspect, the second delay component 218-2 of the feedback microcontroller 230 is configured to receive the differential voltage $\Delta V_k$ and generate a delayed differential voltage $\Delta V_{k-1}$. In an aspect, the delayed differential voltage $\Delta V_{k-1}$ is the differential voltage corresponding to a previous sampling instant (k−1), representing the change in voltage between two earlier time steps. So, the first and second delay components ensure proper timing alignment for differential voltage calculation, which guides the frequency update.

In an aspect, the memory unit 222 of the feedback microcontroller 230 is configured to store program instructions, the error criterion c and a termination limit. The error criterion c is a predefined threshold representing an acceptable deviation between a measured or computed parameter and a target value. The termination limit is a predefined condition at which an iterative or control process is stopped when the error criterion is satisfied or a maximum limit is reached.

The memory unit 222 is configured to receive the differential voltage $\Delta V_k$ from the subtractor at a first input terminal and the delayed differential voltage $\Delta V_{k-1}$ at a second input terminal.

In an aspect, the feedback microcontroller 230 is configured to determine a difference between a differential voltage $\Delta V_k$ and a delayed differential voltage $\Delta V_{k-1}$, i.e., $\Delta V_k - \Delta V_{k-1}$. In an aspect, the values of $\Delta V_k$ and $\Delta V_{k-1}$ are stored in the memory unit 222.

In an aspect, at least one processor of the feedback microcontroller 230 is configured to execute the program instructions to calculate the absolute value of the of the difference between the differential voltage $\Delta V_k$ and the delayed differential voltage $\Delta V_{k-1}$. The absolute value is a non-negative metric representing the magnitude of variation between successive voltage changes, i.e., $|\Delta V_k - \Delta V_{k-1}|$ Further, the feedback microcontroller 230 is configured to compare an absolute value of the difference between the differential voltage $\Delta V_k$ and the delayed differential voltage $\Delta V_{k-1}$ to an error criterion ε. In an aspect, the absolute value of the difference between the differential voltage $\Delta V_k$ and the delayed differential voltage $\Delta V_{k-1}$ is compared with the error criterion ε to determine whether a magnitude of variation between successive voltage differentials falls within a predefined tolerance, thereby indicating whether a control objective is met or whether further iterative adjustment is required.

When the absolute value of the difference between the differential voltage $\Delta V_k$ and the delayed differential voltage $\Delta V_{k-1}$ is less than the error criterion ε, the feedback microcontroller 230 comprises the step-size determination block, which is configured to determine a frequency step size based on the difference between the differential voltage $\Delta V_k$ and the delayed differential voltage $\Delta V_{k-1}$. In an aspect, the frequency step size is a predefined incremental change in the operating frequency applied between successive adjustment steps during a tuning or control process to iteratively approach a target or optimal frequency.

The feedback microcontroller 230 comprises the set frequency block 226, which is configured to update the operating frequency with the frequency step size. In an aspect, the operating frequency is updated with the frequency step size to adjust a current operating frequency by a predetermined incremental frequency value in a defined direction to obtain a revised operating frequency for a subsequent control or tuning iteration.

In an aspect, the step-size determination block 228 of the feedback microcontroller 230 is configured to determine the frequency step size of the updated operating frequency $f_{k+1}$ of the high-frequency inverter based on:

$$f_{k+1} = f_k - \left(\frac{\Delta V_k(f_k) - \Delta V_{k-1}(f_{k-1})}{f_k - f_{k-1}}\right)^{-1} \Delta V_k,$$

where $f_{k+1}$ is an operating frequency at instant in time k−1, $f_k$ is a current operating frequency and $f_{k+1}$ is the updated operating frequency at the instant in time k+1.

In an aspect, when the absolute value of the difference between the differential voltage $\Delta V_k$ and the delayed differential voltage $\Delta V_{k-1}$ is less than the error criterion ε, the feedback microcontroller 230 is configured to determine that the high-frequency inverter 206 is to operate at the updated operating frequency $f_{k+1}$. The high-frequency inverter 206 is configured to operate at the updated operating frequency in response to satisfaction of the error criterion in order to maintain operation at or near the resonant operating frequency, thereby stabilizing system performance, maximizing power transfer efficiency, and preventing unnecessary further frequency adjustments.

In an aspect, when the absolute value of the difference between the differential voltage $\Delta V_k$ and the delayed differential voltage $\Delta V_{k-1}$ is greater than the error criterion $\varepsilon$, the feedback microcontroller 230 comprises the lock frequency block 224, which is configured to determine that the high-frequency inverter 206 is to lock to the current operating frequency $f_k$. When the absolute magnitude of the difference between the differential voltage $\Delta V_k$ and the delayed differential voltage $\Delta V_{k-1}$ exceeds the predefined error criterion $\varepsilon$, the feedback microcontroller 230 determines that the system 200 has not yet converged to a stable operating condition and, in response, configures the high-frequency inverter to lock to the current operating frequency $f_k$ to prevent further frequency deviation while subsequent control actions or evaluations are performed.

In an aspect, the feedback microcontroller 230 is configured to update the operating frequency to compensate for a change in a coupling factor between the primary transformer 208 and the secondary transformer 210 by the generation of the updated operating frequency $f_{k+1}$. The operating frequency is updated to compensate for the change in the coupling factor between the primary transformer 208 and the secondary transformer 210. The operating frequency adjusts the excitation of the primary transformer 208 in response to variations in magnetic coupling, alignment, distance, or load conditions, thereby maintaining efficient power transfer and stable system operation.

In an aspect, the change in the coupling factor is due to one or more of a change in an alignment between the primary transformer 208 and the secondary transformer 210, a change in an orientation of the primary transformer 208 and the secondary transformer 210, and a change in a distance between the primary transformer 208 and the secondary transformer 210.

In an aspect, the feedback microcontroller 230 is configured to update the current operating frequency $f_k$ to the updated operating frequency $f_{k+1}$ to maximize a power provided to the load. Updating the current operating maximizes the power delivered to the load under prevailing coupling and load conditions.

The feedback microcontroller 230 is configured to transmit the updated operating frequency to the high-frequency inverter 206, closing the control loop. The feedback microcontroller 230 ensures continuous adaptation of the operating frequency to track changes in the coupling coefficient k caused by variations in coil distance, alignment, or orientation. Further, the feedback microcontroller 230 iteratively adjusts the inverter frequency to maintain resonance.

Thus, the system 200 is configured for real-time operation, with rapid convergence typically achieved within a few iterations, thereby enhancing power transfer efficiency by dynamically compensating for changes in coil coupling.

Figure 3:
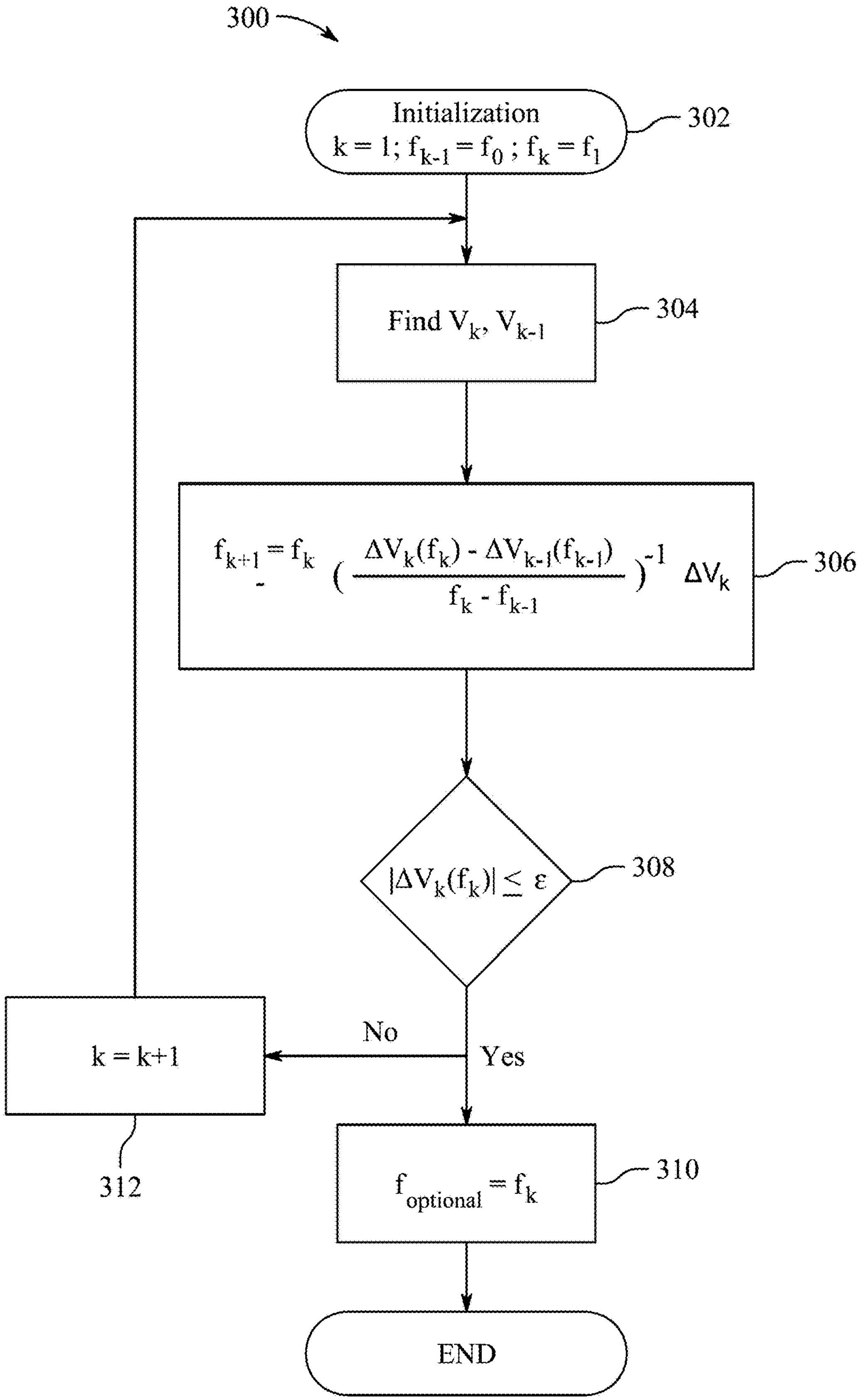
FIG. 3 is an exemplary flow diagram of a tuning algorithm, according to certain embodiments.

FIG. 3 is an exemplary flow diagram 300 of a tuning algorithm.

The adaptive frequency tuning algorithm is employed in the wireless power transfer system. The process begins at the initialization step 302, the iteration counter k is set to 1, and initial frequency values $f_{k-1}$ and $f_k$ are assigned preset starting frequencies $f_0$ and $f_1$, respectively. The initialization step establishes the starting point for the frequency search.

Following initialization, at step 304, the load voltages $V_k$ and $V_{k-1}$ are measured at the current and previous iterations. These voltage measurements are critical feedback parameters reflecting the power transfer efficiency at the respective frequencies.

At step 306, the algorithm computes the next operating frequency $f_{k+1}$ using the iterative formula as given in Equation below $$f_{k+1} = f_k - \left(\frac{\Delta V_k(f_k) - \Delta V_{k-1}(f_{k-1})}{f_k - f_{k-1}}\right)^{-1} \Delta V_k$$

where $\Delta V_k = V_k - V_{k-1}$

The calculation employs a numerical root-finding method akin to the secant method, aiming to identify the frequency at which the load voltage peaks, corresponding to the resonant frequency.

Subsequently, at decision step 308, the feedback microcontroller 230 evaluates whether the absolute difference between successive differential voltages $|\Delta V_k(f_k)|$ is less than or equal to a predefined error threshold $\varepsilon$. If the successive differential voltages $|\Delta V_k(f_k)|$ is less than or equal to the predefined error threshold $\varepsilon$, then the process proceeds to step 310. If the successive differential voltages $|\Delta V_k(f_k)|$ is not less than or equal to the predefined error threshold $\varepsilon$, then the process proceeds to step 312.

At step 310, if the successive differential voltages $|\Delta V_k(f_k)|$ is less than or equal to the predefined error threshold $\varepsilon$, the optimal frequency $f_{optimal}$ is set equal to the current frequency $f_k$, and the algorithm terminates.

At step 312, if the successive differential voltages $|\Delta V_k(f_k)|$ is less than or equal to the predefined error threshold $\varepsilon$, the iteration counter is incremented at step 312 (k=k+1), and the process loops back to step 304 to continue the iterative frequency adjustment.

As shown in FIG. 3, the search loop is configured to terminate when an error associated with $\Delta V_k$ falls below a predefined error threshold $\varepsilon$. When $\Delta V_k$ reaches the prescribed limit, it indicates that the measured voltage $V_k$ has attained a maximum value, thereby signifying that the corresponding operating frequency substantially coincides with the resonant frequency of the system. The selection of the error threshold c is determined in accordance with system design requirements and performance objectives. The smaller value of c provides higher accuracy in resonant frequency estimation at the expense of reduced convergence speed, whereas a larger value of $\varepsilon$ enables faster convergence with a corresponding reduction in estimation accuracy.

Figure 4:
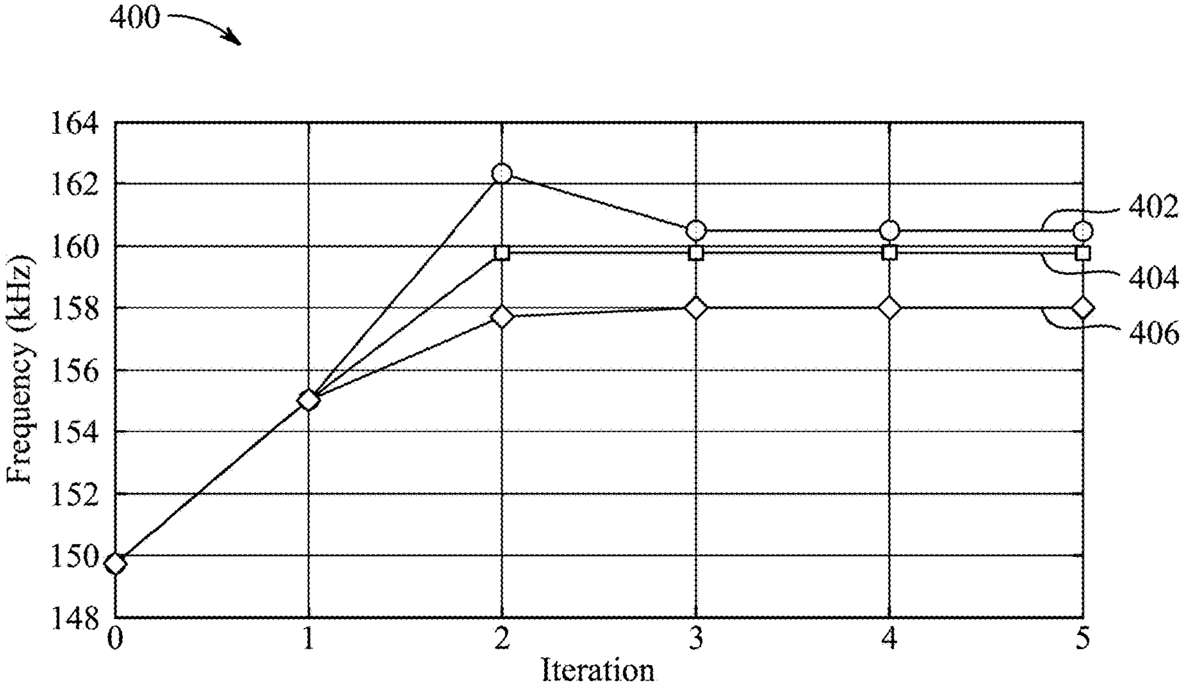
FIG. 4 is an exemplary graphical representation of the resonant frequency tracking using the tuning algorithm for coupling coefficients, according to certain embodiments.

FIG. 4 is an exemplary graphical representation 400 of the resonant frequency tracking using the tuning algorithm for coupling coefficients.

In an aspect, the tuning algorithm was implemented and evaluated using a simplified wireless power transfer circuit comprising a transmitting coil and a receiving coil, each with an inductance of approximately 1 μH. A respective tuning capacitor of approximately 1 μF was electrically coupled in series with each of the transmitting coil and the receiving coil so as to form corresponding resonant circuits. A substantially constant resistive load was coupled to the receiving side to establish controlled, repeatable operating conditions for the performance evaluation of the tuning algorithm.

As illustrated in FIG. 4, the resonant frequency-tracking performance of the tuning algorithm is shown under different magnetic coupling conditions between the transmitting and receiving coils. The graphical representation 400 shows the variation of the coupling coefficient over the resonant frequency. The x-axis represents iteration, and the y-axis represents the frequency in kHz. Curve 402 represents coupling coefficient k=0.3, curve 404 represents k=0.4, and curve 406 represents k=0.5. The results corresponding to resonant frequency tracking under a plurality of operating conditions are presented.

Specifically, FIG. 4 shows the evolution of the operating frequency as the algorithm adapts to coupling coefficient values of approximately 0.3, 0.4, and 0.5. For each coupling coefficient, the algorithm iteratively adjusts the excitation frequency to compensate for coupling-induced shifts in the resonant frequency, thereby converging to the corresponding resonance point. The results demonstrate that the tuning algorithm accurately and rapidly tracks the resonant frequency across varying coupling conditions, confirming its effectiveness in maintaining optimal power transfer despite changes in coil separation, alignment, or orientation.

In order to conduct the tests, an initial excitation frequency of approximately 150 kHz was selected, and an error threshold c of approximately 5 mV was applied. The coupling coefficient was varied within a range of about 0.3 to about 0.5 to emulate variations in inter-coil separation distance, relative alignment, and spatial orientation of the transmitting and receiving coils. As shown, the tuning algorithm effectively tracked changes in the resonant frequency and converged to a stable operating point within approximately 3 iterations, thereby demonstrating rapid convergence and robust adaptation to variations in the coupling coefficient.

Figure 5:
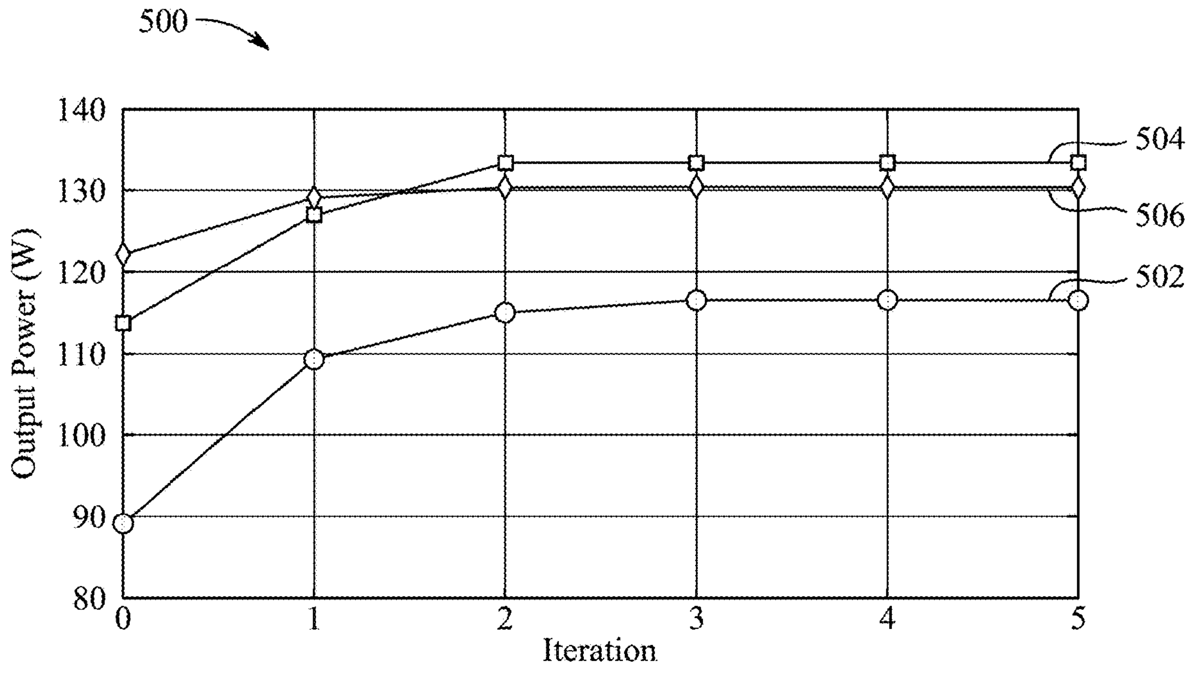
FIG. 5 is an exemplary graphical representation of power transfer enhancement using the algorithm for the coupling coefficients, according to certain embodiments.

FIG. 5 is an exemplary graphical representation 500 of power transfer enhancement using the tuning algorithm for the coupling coefficients.

As illustrated in FIG. 5, the graphical representation 500 shows the power transfer for each of the coupling coefficients. The x-axis represents iteration, and the y-axis represents the output power in kW. Curve 502 represents the coupling coefficient k=0.3, curve 504 represents k=0.4, and curve 506 represents k=0.5. The results of the output (load) power using the tuning algorithm are shown.

FIG. 5 illustrates the enhancement in power transfer achieved by the tuning algorithm under different magnetic coupling conditions between the transmitting coil and the receiving coil. The power delivered to the load for coupling coefficient values of approximately 0.3, 0.4, and 0.5 is shown. As shown, the tuning algorithm dynamically adjusts the operating frequency to track the resonant condition for each coupling coefficient, thereby mitigating detuning caused by variations in coil separation, alignment, or orientation. The results demonstrate that, across all illustrated coupling conditions, operating at or near resonance significantly increases the power transferred to the load, thereby validating the effectiveness of the tuning algorithm in maintaining high power transfer efficiency across a range of coupling conditions.

Figure 6:
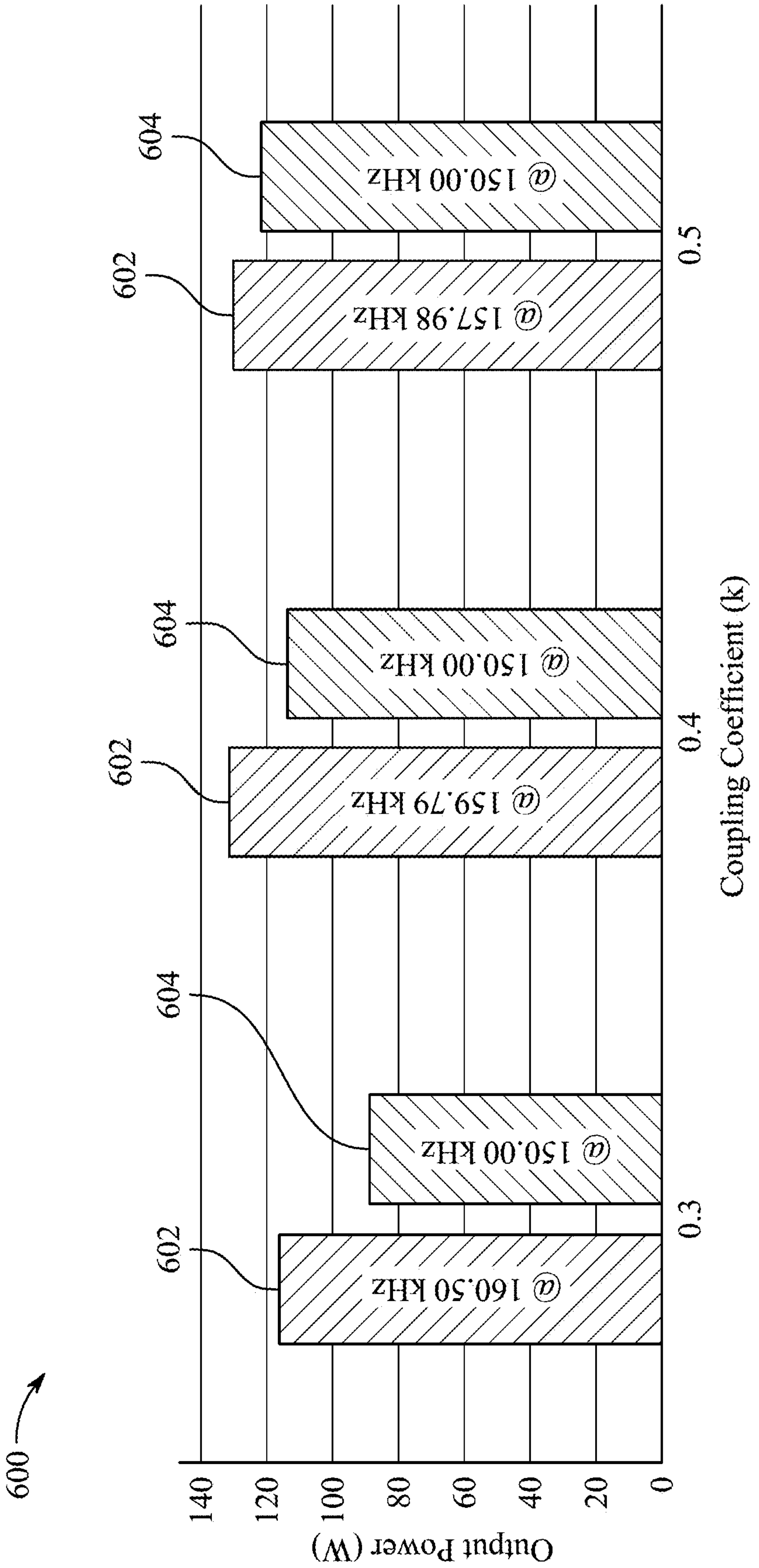
FIG. 6 is an exemplary graphical representation of power transfer comparison using a fixed 150 kHz frequency for the coupling coefficients, according to certain embodiments.

FIG. 6 is an exemplary graphical representation 600 of a power transfer comparison using a fixed 150 kHz frequency for the coupling coefficients.

To verify performance, a comparative analysis was conducted between the power transferred using the tuning algorithm/method and the power delivered under fixed-frequency operation at 150 kHz, selected as a representative design frequency. The comparison results are illustrated in FIG. 6.

As illustrated in FIG. 6, the graphical representation 600 shows the comparison of the power using the resonant frequency for the coupling coefficients. The x-axis represents the coupling coefficient (k), and the y-axis represents the output power in watts. Block 602 represents varying the resonant frequency, for example, 160.50 kHz, 159.79 kHz, and 157.98 kHz. Block 604 represents the fixed resonant frequency of 150 kHz. As indicated by the results, the method achieved a significant increase in transferred power relative to fixed-frequency operation, with increases of approximately 31%, 16%, and 7% for coupling coefficients k=0.3, 0.4, and 0.5, respectively.

FIG. 6 compares power transfer between the adaptive tuning algorithm and a fixed 150 kHz operating frequency for coupling coefficients of approximately 0.3, 0.4, and 0.5, demonstrating the effectiveness of the tuning algorithm in improving power delivery under varying coupling conditions.

The present disclosure enables the determination and tracking of the resonant frequency of a wireless power transfer system at an ultra-high speed, thereby ensuring optimal power transfer under varying operating conditions. Compared to conventional techniques, the invention provides a cost-effective and computationally efficient solution for accurately identifying the resonant frequency of a tuning network in a wireless power transfer configuration across a wide range of coupling conditions, load variations, and alignment scenarios.

The present disclosure is readily implementable within existing wireless power transfer architectures without requiring complex hardware modifications, thereby facilitating adoption across a broad range of battery-powered products and industrial applications. The method exhibits extremely fast convergence, enabling rapid adaptation to change in system operating conditions. Furthermore, the speed and accuracy of the resonant frequency determination process are flexibly configurable by preselecting algorithm parameters during initial system setup, enabling a trade-off between convergence speed and precision to meet specific design and application requirements.

Figure 7:
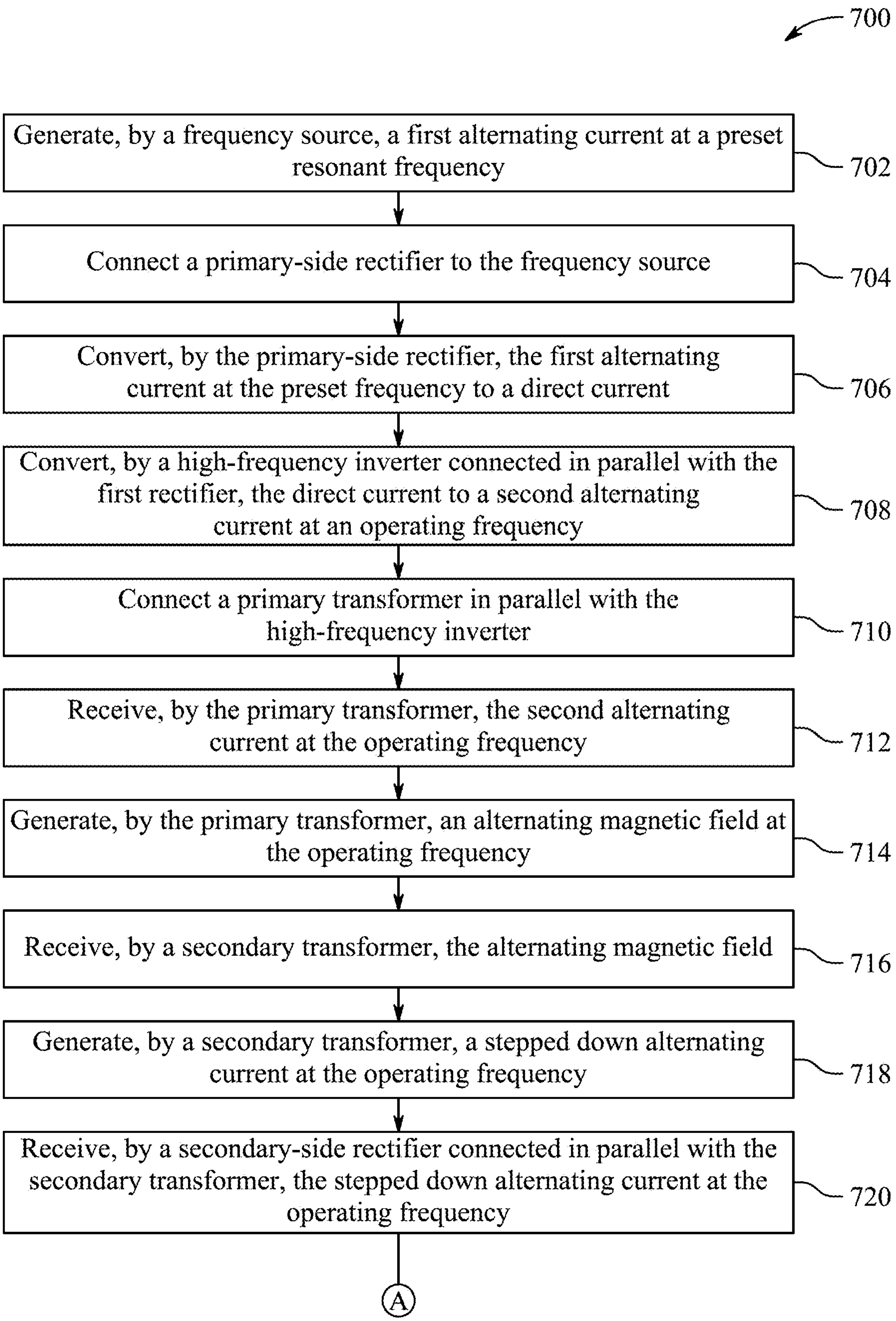
FIG. 7 is an exemplary flow diagram of a method for wireless power transfer to a rechargeable battery, according to certain embodiments.
Figure 7:
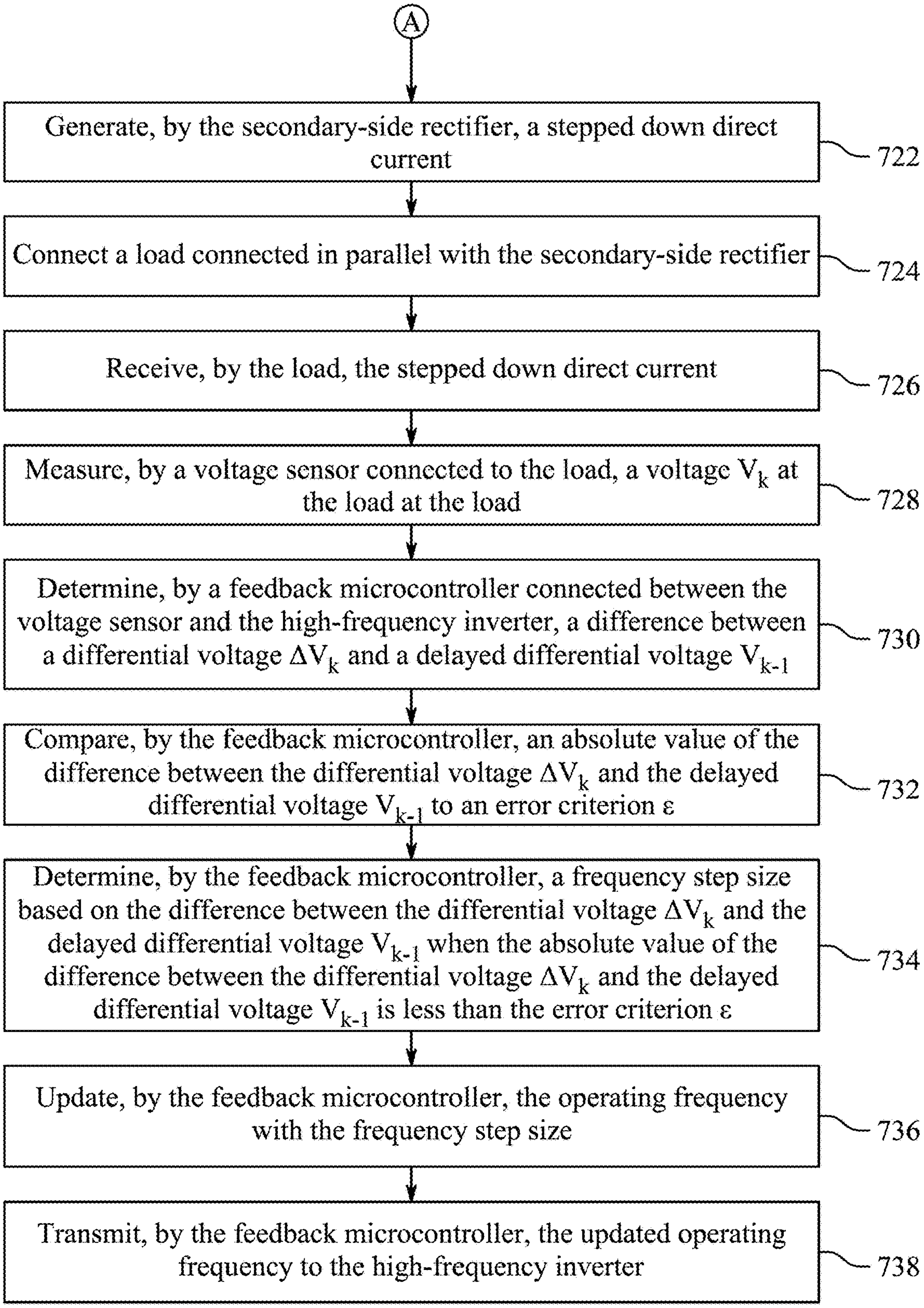

FIG. 7 is an exemplary flow diagram of a method 700 for wireless power transfer to the rechargeable battery.

At step 702, the method 700 includes generating, by a frequency source 202, a first alternating current at a preset resonant frequency.

At step 704, the method 700 includes connecting a primary-side rectifier 204 to the frequency source.

At step 706, the method 700 includes converting, by the primary-side rectifier 204, the first alternating current at the preset frequency to a direct current.

At step 708, the method 700 includes converting, by a high-frequency inverter 206 connected in parallel with the primary-side rectifier 204, the direct current to a second alternating current at an operating frequency.

At step 710, the method 700 includes connecting a primary transformer 208 in parallel with the high-frequency inverter 206.

At step 712, the method 700 includes receiving, by the primary transformer 208, the second alternating current at the operating frequency.

At step 714, the method 700 includes generating, by the primary transformer 208, an alternating magnetic field at the operating frequency.

At step 716, the method 700 includes receiving, by a secondary transformer 210, the alternating magnetic field.

At step 718, the method 700 includes generating, by a secondary transformer 210, a stepped down alternating current at the operating frequency.

At step 720, the method 700 includes receiving, by a secondary-side rectifier 212 connected in parallel with the secondary transformer 210, the stepped down alternating current at the operating frequency.

At step 722, the method 700 includes generating, by the secondary-side rectifier 212, a stepped down direct current.

At step 724, the method 700 includes connecting a load 214 connected in parallel with the secondary-side rectifier.

At step 726, the method 700 includes receiving, by the load 214, the stepped down direct current.

At step 728, the method 700 includes measuring, by a voltage sensor 216 connected to the load, a voltage $V_k$ at the load at the load 214. In an aspect, the feedback microcontroller 230 measures the voltage $V_k$ at a first instant in time k.

At step 730, the method 700 includes determining, by a feedback microcontroller 230 connected between the voltage sensor 216 and the high-frequency inverter 206, a difference between a differential voltage $\Delta V_k$ and a delayed differential voltage $\Delta V_{k-1}$. In an aspect, the method includes connecting a first delay component 218-1 to the voltage sensor and generating, by the first delay component, a delayed voltage $V_{k-1}$. The positive input terminal 221 of a subtractor is configured to receive the voltage $V_k$ from the voltage sensor 216. The negative input terminal 220 is configured to receive the delayed voltage $V_{k-1}$ from the first delay component. The subtractor 219 generates a differential voltage $\Delta V_k$ given by $\Delta V_k = V_k - V_{k-1}$.

In an aspect, a second delay component 218-2 is connected to the subtractor 219. The second delay component generates the differential voltage $\Delta V_k$ and a delayed differential voltage $\Delta V_{k-1}$. A memory unit 222 stores program instructions, the error criterion ε and a termination limit. The memory unit 222 receives the differential voltage $\Delta V_k$ from the subtractor at a first input terminal and the delayed differential voltage $\Delta V_{k-1}$ at a second input terminal. At least one processor configured to execute the program instructions to compute the absolute value of the of the difference between the differential voltage $\Delta V_k$ and the delayed differential voltage $\Delta V_{k-1}$.

At step 732, the method 700 includes comparing, by the feedback microcontroller 230, an absolute value of the difference between the differential voltage $\Delta V_k$ and the delayed differential voltage $\Delta V_{k-1}$ to an error criterion ε.

At step 734, the method 700 includes determining, by the feedback microcontroller 230, a frequency step size based on the difference between the differential voltage $\Delta V_k$ and the delayed differential voltage $\Delta V_{k-1}$ when the absolute value of the difference between the differential voltage $\Delta V_k$ and the delayed differential voltage $\Delta V_{k-1}$ is less than the error criterion ε.

At step 736, the method 700 includes updating, by the feedback microcontroller 230, the operating frequency with the frequency step size. In an aspect, the feedback microcontroller 230 determines the frequency step size of the updated operating frequency $f_{k+1}$ of the high-frequency inverter based on $$f_{k+1} = f_k - \left(\frac{\Delta V_k(f_k) - \Delta V_{k-1}(f_{k-1})}{f_k - f_{k-1}}\right)^{-1} \Delta V_k,$$

where, $f_{k+1}$ is an operating frequency at instant in time k−1, $f_k$ is a current operating frequency and $f_{k+1}$ is the updated operating frequency at the instant in time k+1.

At step 738, the method 700 includes transmitting, by the feedback microcontroller 230, the updated operating frequency to the high-frequency inverter. In an aspect, the high-frequency inverter is operated at the updated operating frequency $f_{k+1}$ when the absolute value of the of the difference between the differential voltage $\Delta V_k$ and the delayed differential voltage $\Delta V_{k-1}$ is less than the error criterion ε. The operating frequency is locked at the current operating frequency $f_k$ when the absolute value of the of the difference between the differential voltage $\Delta V_k$ and the delayed differential voltage $\Delta V_{k-1}$ is greater than the error criterion ε.

Further, the feedback microcontroller 230 compensates for a change in a coupling factor between the primary transformer 208 and the secondary transformer 210 by generating the updated operating frequency $f_{k+1}$. The updated operating frequency $f_{k+1}$ is generated to compensate for a change in a coupling factor between the primary transformer and the secondary transformer due to a change in an alignment between the primary transformer and the secondary transformer, a change in an orientation of the primary transformer and the secondary transformer, and a change in a distance between the primary transformer and the secondary transformer.

Thus, a power provided to the load is maximized by updating the current operating frequency $f_k$ to the updated operating frequency $f_{k+1}$.

In an exemplary embodiment, a wireless battery charging system 200 comprises a frequency source 202 configured to generate a first alternating current at a preset resonant frequency, a primary-side rectifier 204 coupled to the frequency source. The primary-side rectifier 204 is configured to convert the first alternating current at the preset resonance frequency to a direct current. The wireless battery charging system 200 comprises a high-frequency inverter 206 connected in parallel with the primary-side rectifier. The high-frequency inverter 206 is configured to convert the direct current to a second alternating current at an operating frequency. The wireless battery charging system 200 comprises a primary transformer connected in parallel with the high-frequency inverter 206. The primary transformer 208 is configured to receive the second alternating current at the operating frequency and generate an alternating magnetic field at the operating frequency. The wireless battery charging system 200 comprises a secondary transformer 210 configured to receive the alternating magnetic field and generate a stepped down alternating current at the operating frequency and a secondary-side rectifier 212 connected in parallel with the secondary transformer. The secondary-side rectifier 212 is configured to receive the stepped down alternating current at the operating frequency and generate a stepped down direct current. The wireless battery charging system 200 comprises a load connected in parallel with the secondary-side rectifier 212. The load is configured to receive the stepped down direct current. The voltage sensor 216 is connected to the load 214. The voltage sensor is configured to measure a voltage $V_k$ at the load at the load. A feedback microcontroller 230 is connected between the voltage sensor 216 and the high-frequency inverter 206. The feedback microcontroller 230 is configured to determine a difference between a differential voltage $\Delta V_k$ and a delayed differential voltage $\Delta V_{k-1}$ and compare an absolute value of the difference between the differential voltage $\Delta V_k$ and the delayed differential voltage $\Delta V_{k-1}$ to an error criterion ε, when the absolute value of the difference between the differential voltage $\Delta V_k$ and the delayed differential voltage $\Delta V_{k-1}$ is less than the error criterion ε. The feedback microcontroller 230 is configured to determine a frequency step size based on the difference between the differential voltage $\Delta V_k$ and the delayed differential voltage $\Delta V_{k-1}$, update the operating frequency with the frequency step size, and transmit the updated operating frequency to the high-frequency inverter.

In an aspect, the load 214 comprises a rechargeable battery.

In an aspect, the voltage $V_k$ measured at the load is measured at a first instant in time k.

In an aspect, the feedback microcontroller 230 comprises a first delay component 218-1 configured to receive the voltage $V_k$ from the voltage sensor and generate a delayed voltage $V_{k-1}$. A subtractor 219 has a positive input terminal configured to receive the voltage $V_k$ from the voltage sensor and a negative input terminal configured to receive the delayed voltage $V_{k-1}$ from the first delay component 218-1. The subtractor 219 is configured to generate a differential voltage $\Delta V_k$ given by $\Delta V_k = V_k - V_{k-1}$.

In an aspect, the feedback microcontroller 230 further comprises a second delay component 218-2 configured to receive the differential voltage $\Delta V_k$ and generate a delayed differential voltage $\Delta V_{k-1}$ and a memory unit 222 configured to store program instructions, the error criterion ε and a termination limit. The memory unit 222 is configured to receive the differential voltage $\Delta V_k$ from the subtractor at a first input terminal and the delayed differential voltage $\Delta V_{k-1}$ at a second input terminal. At least one processor 231 is configured to execute the program instructions to calculate the absolute value of the of the difference between the differential voltage $\Delta V_k$ and the delayed differential voltage $\Delta V_{k-1}$.

In an aspect, the feedback microcontroller 230 is configured to determine the frequency step size of the updated operating frequency $f_{k+1}$ of the high-frequency inverter based on:

$$f_{k+1} = f_k - \left(\frac{\Delta V_k(f_k) - \Delta V_{k-1}(f_{k-1})}{f_k - f_{k-1}}\right)^{-1} \Delta V_k,$$

where $f_{k+1}$ is an operating frequency at instant in time k−1, $f_k$ is a current operating frequency and $f_{k+1}$ is the updated operating frequency at the instant in time k+1.

In an aspect, the feedback microcontroller 230 is configured to determine, when the absolute value of the difference between the differential voltage $\Delta V_k$ and the delayed differential voltage $\Delta V_{k-1}$ is less than the error criterion ε, that the high-frequency inverter is to operate at the updated operating frequency $f_{k+1}$.

In an aspect, the feedback microcontroller 230 is configured to determine, when the absolute value of the of the difference between the differential voltage $\Delta V_k$ and the delayed differential voltage $\Delta V_{k-1}$ is greater than the error criterion ε, that the high-frequency inverter is to lock to the current operating frequency $f_k$.

In an aspect, the feedback microcontroller 230 is configured to update the operating frequency to compensate for a change in a coupling factor between the primary transformer 208 and the secondary transformer 210 by the generation of the updated operating frequency $f_{k+1}$.

In an aspect, the change in the coupling factor is due to one or more of a change in an alignment between the primary transformer 208 and the secondary transformer 210, a change in an orientation of the primary transformer and the secondary transformer, and a change in a distance between the primary transformer and the secondary transformer.

In an aspect, the feedback microcontroller 230 is configured to update the current operating frequency $f_k$ to the updated operating frequency $f_{k+1}$ in order to maximize a power provided to the load 214.

In another exemplary embodiment, a method 700 for wireless power transfer to a rechargeable battery is disclosed. The method 700 comprises generating, by a frequency source, a first alternating current at a preset resonant frequency, connecting a primary-side rectifier to the frequency source, and converting, by the primary-side rectifier, the first alternating current at the preset frequency to a direct current. The method 700 comprises converting, by a high-frequency inverter connected in parallel with the first rectifier, the direct current to a second alternating current at an operating frequency and connecting a primary transformer in parallel with the high-frequency inverter. The method 700 comprises receiving, by the primary transformer, the second alternating current at the operating frequency, generating, by the primary transformer, an alternating magnetic field at the operating frequency, and receiving, by a secondary transformer, the alternating magnetic field. The method 700 comprises generating, by a secondary transformer, a stepped down alternating current at the operating frequency, receiving, by a secondary-side rectifier connected in parallel with the secondary transformer, the stepped down alternating current at the operating frequency, and generating, by the secondary-side rectifier, a stepped down direct current. The method 700 comprises connecting a load connected in parallel with the secondary-side rectifier and receiving, by the load, the stepped down direct current. The method comprises measuring, by a voltage sensor connected to the load, a voltage $V_k$ at the load at the load and determining, by a feedback microcontroller 230 connected between the voltage sensor and the high-frequency inverter, a difference between a differential voltage $\Delta V_k$ and a delayed differential voltage $\Delta V_{k-1}$. The method 700 comprises comparing, by the feedback microcontroller 230, an absolute value of the difference between the differential voltage $\Delta V_k$ and the delayed differential voltage $\Delta V_{k-1}$ to an error criterion ε and determining, by the feedback microcontroller 230, a frequency step size based on the difference between the differential voltage $\Delta V_k$ and the delayed differential voltage $\Delta V_{k-1}$, when the absolute value of the difference between the differential voltage $\Delta V_k$ and the delayed differential voltage $\Delta V_{k-1}$ is less than the error criterion ε. The method 700 comprises updating, by the feedback microcontroller 230, the operating frequency with the frequency step size and transmitting, by the feedback microcontroller 230, the updated operating frequency to the high-frequency inverter.

In an aspect, the method 700 further comprises measuring, by the feedback microcontroller 230, the voltage $V_k$ at a first instant in time k.

In an aspect, the method 700 further comprises connecting a first delay component to the voltage sensor, generating, by the first delay component, a delayed voltage $V_{k-1}$, connecting a positive input terminal of a subtractor to receive the voltage $V_k$ from the voltage sensor and connecting a negative input terminal configured to receive the delayed voltage $V_{k-1}$ from the first delay component, and generating, by the subtractor, a differential voltage $\Delta V_k$ given by $\Delta V_k = V_k - V_{k-1}$.

In an aspect, the method 700 further comprises connecting a second delay component to the subtractor, receiving, by the second delay component, the differential voltage $\Delta V_k$, generating, by the second delay component, a delayed differential voltage $\Delta V_{k-1}$, connecting a memory unit storing program instructions, the error criterion ε and a termination limit, to receive the differential voltage $\Delta V_k$ from the subtractor at a first input terminal and the delayed differential voltage $\Delta V_{k-1}$ at a second input terminal and computing, by at least one processor configured to execute the program instructions, the absolute value of the of the difference between the differential voltage $\Delta V_k$ and the delayed differential voltage $\Delta V_{k-1}$.

In an aspect, the method 700 further comprises determining, by the feedback microcontroller 230, the frequency step size of the updated operating frequency $f_{k+1}$ of the high-frequency inverter based on:

$$f_{k+1} = f_k - \left(\frac{\Delta V_k(f_k) - \Delta V_{k-1}(f_{k-1})}{f_k - f_{k-1}}\right)^{-1} \Delta V_k,$$

where, $f_{k+1}$ is an operating frequency at instant in time k−1, $f_k$ is a current operating frequency and $f_{k+1}$ is the updated operating frequency at the instant in time k+1.

In an aspect, the method 700 further comprises operating the high-frequency inverter at the updated operating frequency $f_{k+1}$ when the absolute value of the of the difference between the differential voltage $\Delta V_k$ and the delayed differential voltage $\Delta V_{k-1}$ is less than the error criterion $\varepsilon$; and locking the operating frequency at the current operating frequency $f_k$ when the absolute value of the of the difference between the differential voltage $\Delta V_k$ and the delayed differential voltage $\Delta V_{k-1}$ is greater than the error criterion $\varepsilon$.

In an aspect, the method 700 further comprises compensating, by the feedback microcontroller 230, for a change in a coupling factor between the primary transformer and the secondary transformer by generating the updated operating frequency $f_{k+1}$.

In an aspect, the method 700 comprises generating the updated operating frequency $f_k$+1 to compensate for a change in a coupling factor between the primary transformer and the secondary transformer due to a change in an alignment between the primary transformer and the secondary transformer, a change in an orientation of the primary transformer and the secondary transformer, and a change in a distance between the primary transformer and the secondary transformer.

In an aspect, the method 700 further comprises maximizing, by the feedback microcontroller 230, a power provided to the load by updating the current operating frequency $f_k$ to the updated operating frequency $f_{k+1}$.

Figure 8:
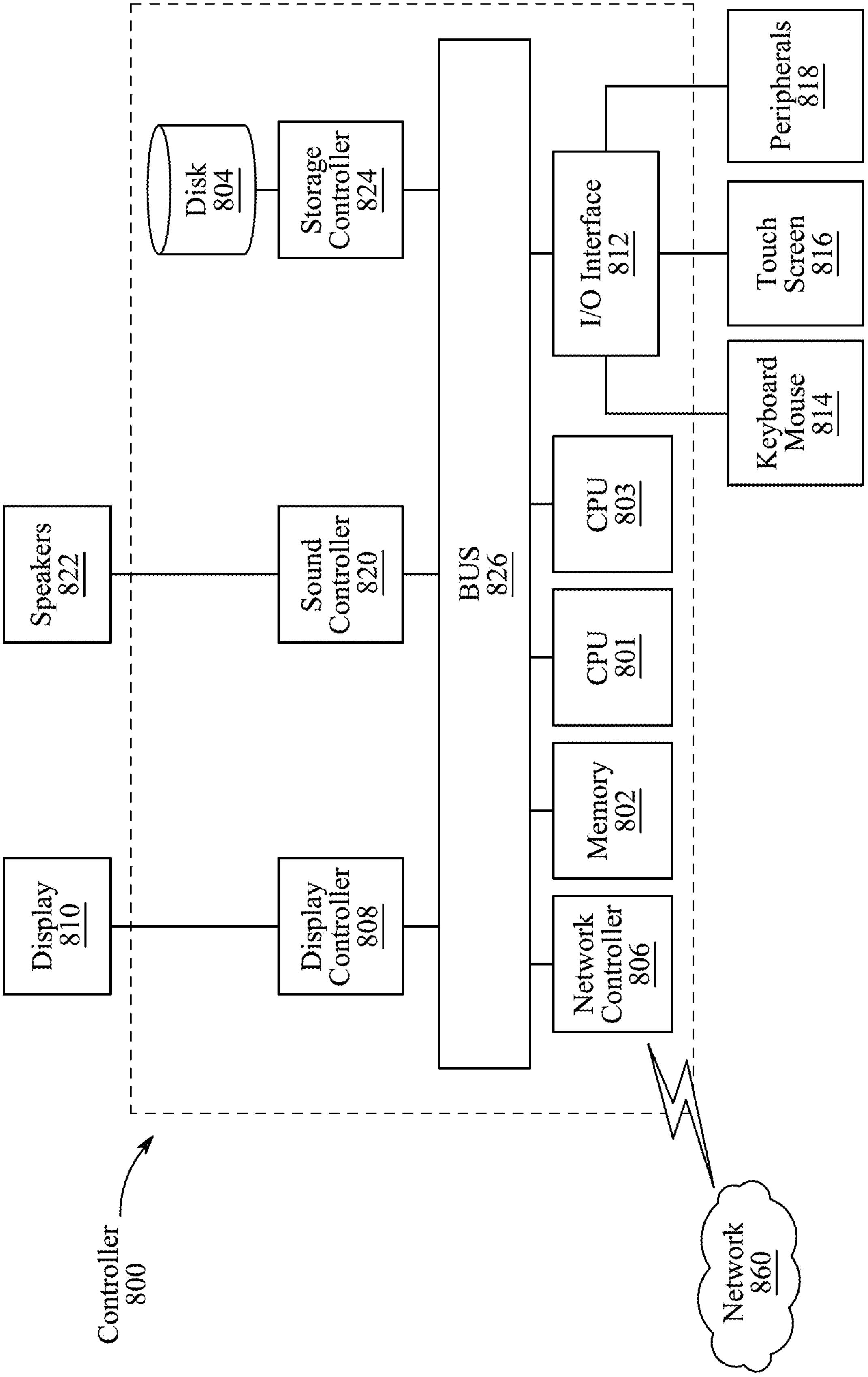
FIG. 8 is an illustration of a non-limiting example of details of computing hardware used in the computing system, according to certain embodiments.

Next, further details of the hardware description of the computing environment according to exemplary embodiments is described with reference to FIG. 8. In FIG. 8, a controller 800 is described is representative of the feedback microcontroller 230 of system 200 of FIG. 2 in which the controller is a computing device which includes a CPU 801 which performs the processes described above/below. The process data and instructions may be stored in memory 802. These processes and instructions may also be stored on a storage medium disk 804 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 801, 803 and an operating system such as Microsoft Windows 7, Microsoft Windows 10, Microsoft Windows 11, UNIX, Solaris, LINUX, Apple MAC-OS and other systems known to those skilled in the art.

The hardware elements in order to achieve the computing device may be realized by various circuitry elements, known to those skilled in the art. For example, CPU 801 or CPU 803 may be a Xenon or Core processor from Intel of America or an Opteron processor from AMD of America, or may be other processor types that would be recognized by one of ordinary skill in the art. Alternatively, the CPU 801, 803 may be implemented on an FPGA, ASIC, PLD or using discrete logic circuits, as one of ordinary skill in the art would recognize. Further, CPU 801, 803 may be implemented as multiple processors cooperatively working in parallel to perform the instructions of the inventive processes described above.

The computing device in FIG. 8 also includes a network controller 806, such as an Intel Ethernet PRO network interface card from Intel Corporation of America, for interfacing with network 860. As can be appreciated, the network 860 can be a public network, such as the Internet, or a private network such as an LAN or WAN network, or any combination thereof and can also include PSTN or ISDN sub-networks. The network 860 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 808, such as a NVIDIA GeForce GTX or Quadro graphics adaptor from NVIDIA Corporation of America for interfacing with display 810, such as a Hewlett Packard HPL2445w LCD monitor. A general purpose I/O interface 812 interfaces with a keyboard and/or mouse 814 as well as a touch screen panel 816 on or separate from display 810. General purpose I/O interface also connects to a variety of peripherals 818 including printers and scanners, such as an OfficeJet or DeskJet from Hewlett Packard.

A sound controller 820 is also provided in the computing device such as Sound Blaster X-Fi Titanium from Creative, to interface with speakers/microphone 822 thereby providing sounds and/or music.

The general purpose storage controller 824 connects the storage medium disk 804 with communication bus 826, which may be an ISA, EISA, VESA, PCI, or similar, for interconnecting all of the components of the computing device. A description of the general features and functionality of the display 810, keyboard and/or mouse 814, as well as the display controller 808, storage controller 824, network controller 806, sound controller 820, and general purpose I/O interface 812 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 8.

Figure 9:
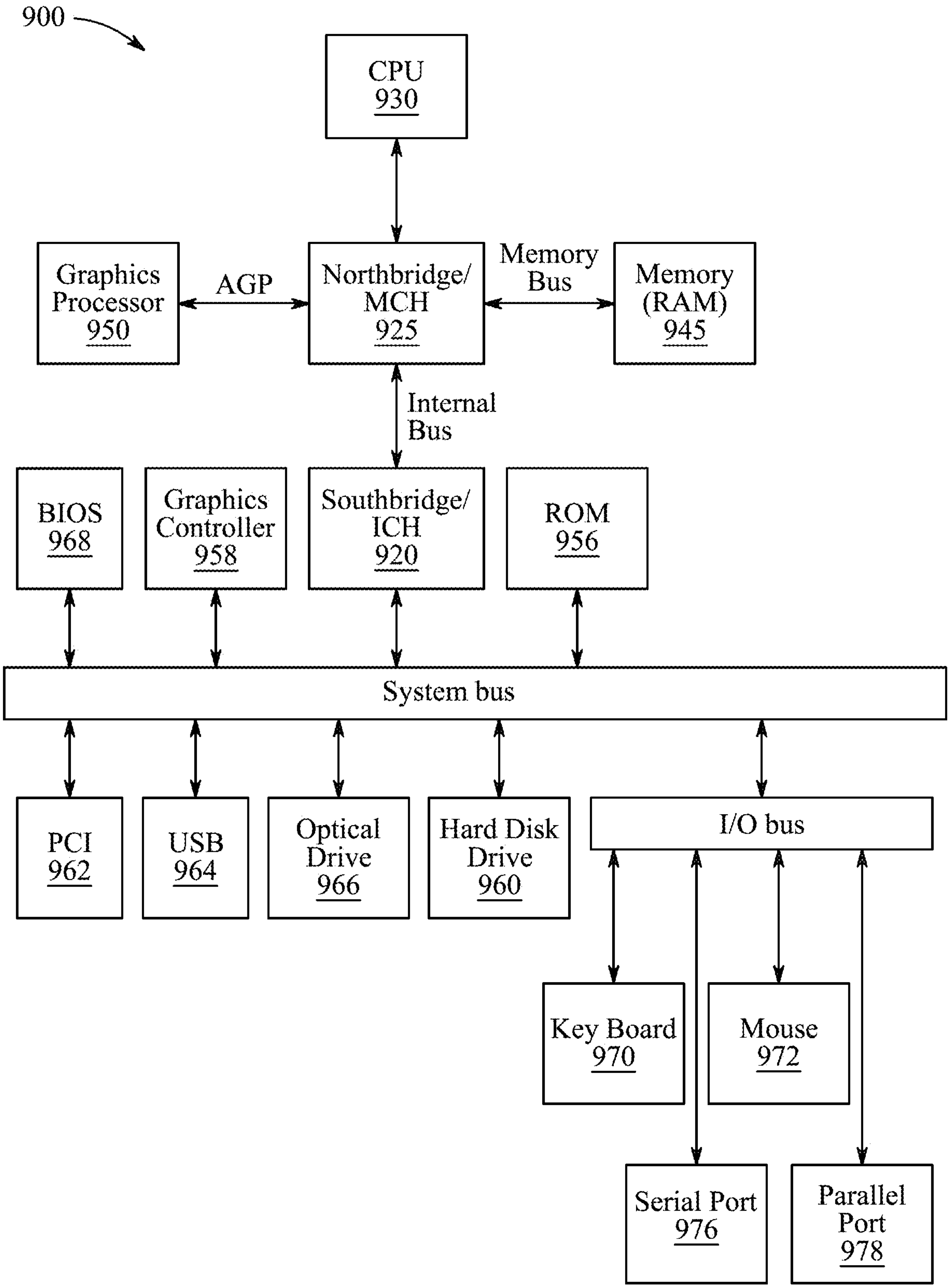
FIG. 9 is an exemplary schematic diagram of a data processing system used within the computing system, according to certain embodiments.

FIG. 9 shows a schematic diagram of a data processing system, according to certain embodiments, for performing the functions of the exemplary embodiments. The data processing system is an example of a computer in which code or instructions implementing the processes of the illustrative embodiments may be located.

In FIG. 9, data processing system 900 employs a hub architecture including a north bridge and memory controller hub (NB/MCH) 925 and a south bridge and input/output (I/O) controller hub (SB/ICH) 920. The central processing unit (CPU) 930 is connected to NB/MCH 925. The NB/MCH 925 also connects to the memory 945 via a memory bus and connects to the graphics processor 950 via an accelerated graphics port (AGP). The NB/MCH 925 also connects to the SB/ICH 920 via an internal bus (e.g., a unified media interface or a direct media interface). The CPU Processing unit 930 may contain one or more processors and even may be implemented using one or more heterogeneous processor systems.

Figure 10:
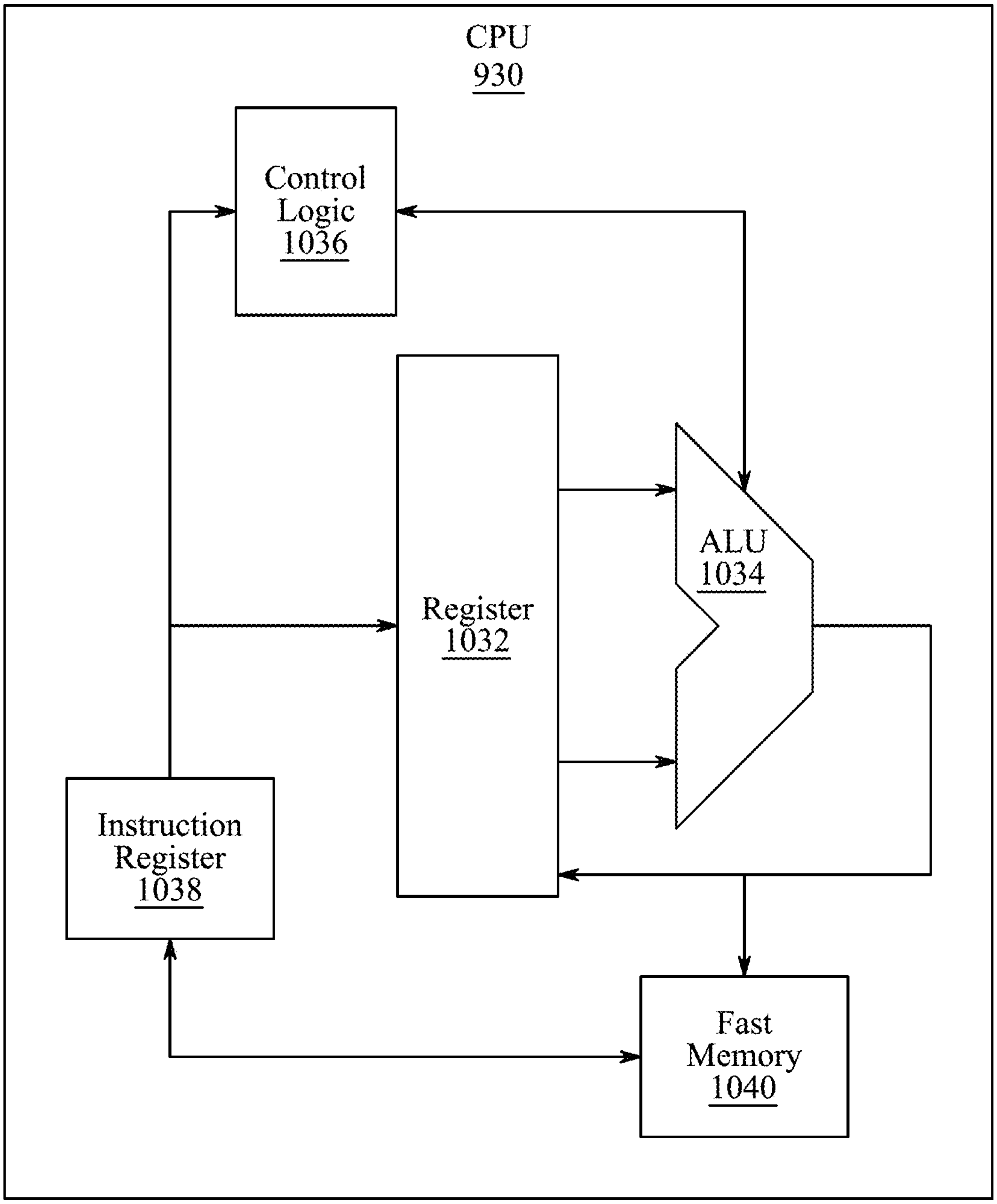
FIG. 10 is an exemplary schematic diagram of a processor used with the computing system, according to certain embodiments.

For example, FIG. 10 shows one implementation of CPU 930. In one implementation, the instruction register 1038 retrieves instructions from the fast memory 1040. At least part of these instructions are fetched from the instruction register 1038 by the control logic 1036 and interpreted according to the instruction set architecture of the CPU 930. Part of the instructions can also be directed to the register 1032. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 1034 that loads values from the register 1032 and performs logical and mathematical operations on the loaded values according to the instructions. The results from these operations can be feedback into the register and/or stored in the fast memory 1040. According to certain implementations, the instruction set architecture of the CPU 1030 can use a reduced instruction set architecture, a complex instruction set architecture, a vector processor architecture, a very large instruction word architecture. Furthermore, the CPU 1030 can be based on the Von Neuman model or the Harvard model. The CPU 1030 can be a digital signal processor, an FPGA, an ASIC, a PLA, a PLD, or a CPLD. Further, the CPU 830 can be an x86 processor by Intel or by AMD; an ARM processor, a Power architecture processor by, e.g., IBM, a SPARC architecture processor by Sun Microsystems or by Oracle or other known CPU architecture.

Referring again to FIG. 9, the data processing system 900 can include that the SB/ICH 920 is coupled through a system bus to an I/O Bus, a read only memory (ROM) 956, universal serial bus (USB) port 964, a flash binary input/output system (BIOS) 968, and a graphics controller 958. PCI/PCIe devices can also be coupled to SB/ICH 988 through a PCI bus 962.

The PCI devices may include, for example, Ethernet adapters, add-in cards, and PC cards for notebook computers. The Hard disk drive 960 and CD-ROM 966 can use, for example, an integrated drive electronics (IDE) or serial advanced technology attachment (SATA) interface. In one implementation the I/O bus can include a super I/O (SIO) device.

Further, the hard disk drive (HDD) 960 and optical drive 966 can also be coupled to the SB/ICH 920 through a system bus. In one implementation, a keyboard 970, a mouse 972, a parallel port 978, and a serial port 976 can be connected to the system bus through the I/O bus. Other peripherals and devices that can be connected to the SB/ICH 920 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 11:
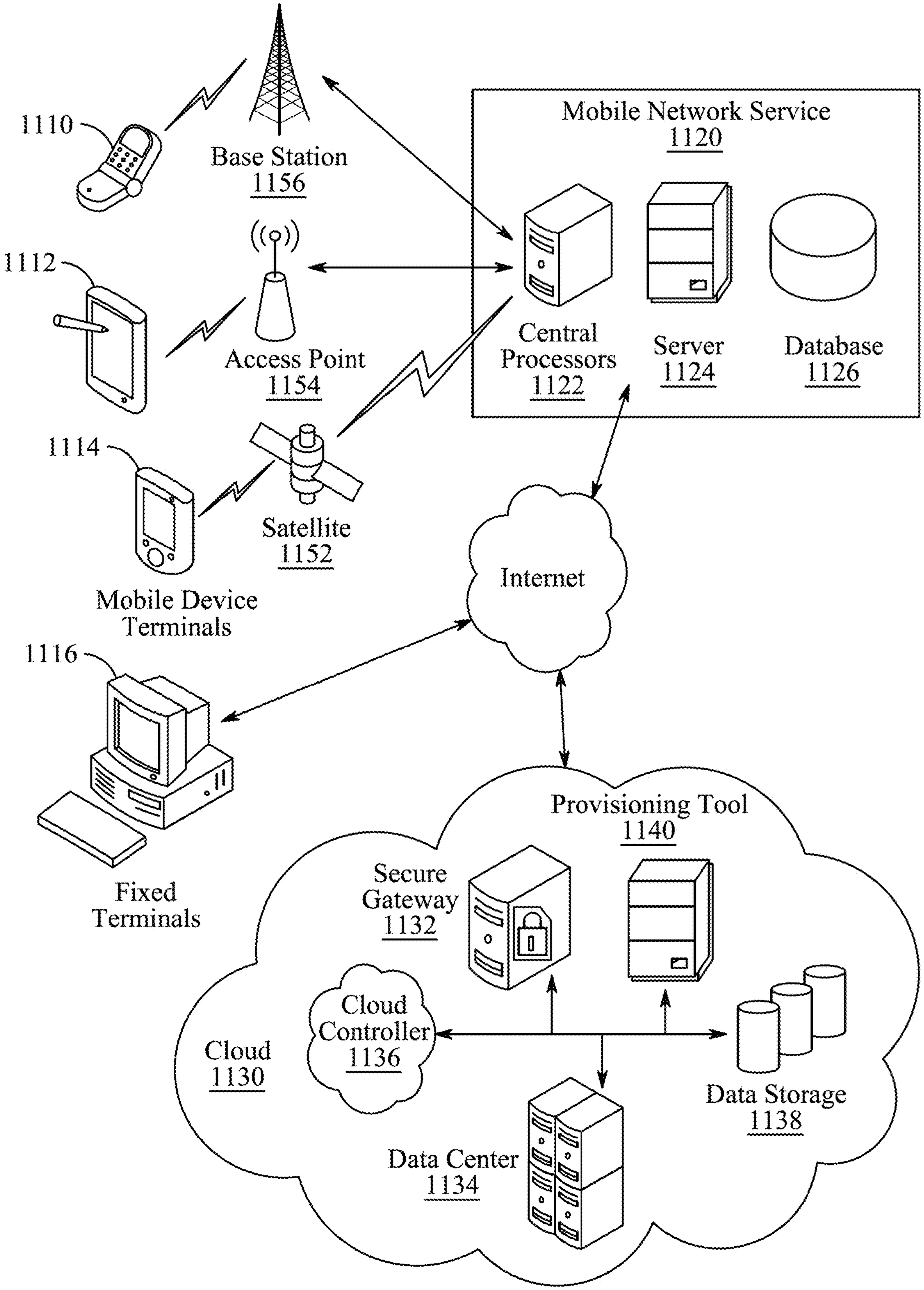
FIG. 11 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, such as cloud 1130 including a cloud controller 1136, a secure gateway 1132, a data center 1134, data storage 1138 and a provisioning tool 1140, and mobile network services 1120 including central processors 1122, a server 1124 and a database 1126, which may share processing, as shown by FIG. 11, in addition to various human interface and communication devices (e.g., display monitors 1116, smart phones 1110, tablets 1112, personal digital assistants (PDAs) 1114). The network may be a private network, such as a LAN, satellite 1152 or WAN 1154, or be a public network, may such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A wireless battery charging system, comprising:

a frequency source configured to generate a first alternating current at a preset resonant frequency;

a primary-side rectifier coupled to the frequency source, wherein the primary-side rectifier is configured to convert the first alternating current at the preset resonance frequency to a direct current;

a high-frequency inverter connected in parallel with the primary-side rectifier, wherein the high-frequency inverter is configured to convert the direct current to a second alternating current at an operating frequency; and a primary transformer connected in parallel with the high-frequency inverter, wherein the primary transformer is configured to receive the second alternating current at the operating frequency and generate an alternating magnetic field at the operating frequency;

a secondary transformer configured to receive the alternating magnetic field and generate a stepped down alternating current at the operating frequency;

a secondary-side rectifier connected in parallel with the secondary transformer, wherein the secondary-side rectifier is configured to receive the stepped down alternating current at the operating frequency and generate a stepped down direct current;

a load connected in parallel with the secondary-side rectifier, wherein the load is configured to receive the stepped down direct current;

a voltage sensor connected to the load, wherein the voltage sensor is configured to measure a voltage $V_k$ at the load at the load; and a feedback microcontroller connected between the voltage sensor and the high-frequency inverter, wherein the feedback microcontroller is configured to:

determine a difference between a differential voltage $\Delta V_k$ and a delayed differential voltage $\Delta V_{k-1}$;

compare an absolute value of the difference between the differential voltage $\Delta V_k$ and the delayed differential voltage $\Delta V_{k-1}$ to an error criterion ε;

when the absolute value of the difference between the differential voltage $\Delta V_k$ and the delayed differential voltage $\Delta V_{k-1}$ is less than the error criterion ε, determine a frequency step size based on the difference between the differential voltage $\Delta V_k$ and the delayed differential voltage $\Delta V_{k-1}$;

update the operating frequency with the frequency step size; and transmit the updated operating frequency to the high-frequency inverter.

2. The wireless battery charging system of claim 1, wherein the load comprises a rechargeable battery.

3. The wireless battery charging system of claim 1, wherein the voltage $V_k$ measured at the load is measured at a first instant in time k.

4. The wireless battery charging system of claim 3, wherein the feedback microcontroller comprises:

a first delay component configured to receive the voltage $V_k$ from the voltage sensor and generate a delayed voltage $V_{k-1}$; and a subtractor having a positive input terminal configured to receive the voltage $V_k$ from the voltage sensor and a negative input terminal configured to receive the delayed voltage $V_{k-1}$ from the first delay component, wherein the subtractor is configured to generate a differential voltage $\Delta V_k$ given by $\Delta V_k = V_k - V_{k-1}$.

5. The wireless battery charging system of claim 4, wherein the feedback microcontroller further comprises:

a second delay component configured to receive the differential voltage $\Delta V_k$ and generate a delayed differential voltage $\Delta V_{k-1}$;

a memory unit configured to store program instructions, the error criterion ε and a termination limit, wherein the memory unit is configured to receive the differential voltage $\Delta V_k$ from the subtractor at a first input terminal and the delayed differential voltage $\Delta V_{k-1}$ at a second input terminal; and at least one processor configured to execute the program instructions to calculate the absolute value of the of the difference between the differential voltage $\Delta V_k$ and the delayed differential voltage $\Delta V_{k-1}$.

6. The wireless battery charging system of claim 5, wherein the feedback microcontroller is configured to determine the frequency step size of the updated operating frequency $f_{k+1}$ of the high-frequency inverter based on:

$$f_{k+1} = f_k - \left(\frac{\Delta V_k(f_k) - \Delta V_{k-1}(f_{k-1})}{f_k - f_{k-1}}\right)^{-1} \Delta V_k,$$

wherein $f_{k+1}$ is an operating frequency at instant in time k−1, $f_k$ is a current operating frequency and $f_{k+1}$ is the updated operating frequency at the instant in time k+1.

7. The wireless battery charging system of claim 6, wherein the feedback microcontroller is configured to determine, when the absolute value of the difference between the differential voltage $\Delta V_k$ and the delayed differential voltage $\Delta V_{k-1}$ is less than the error criterion ε, that the high-frequency inverter is to operate at the updated operating frequency $f_{k+1}$.

8. The wireless battery charging system of claim 7, wherein the feedback microcontroller is configured to determine, when the absolute value of the of the difference between the differential voltage $\Delta V_k$ and the delayed differential voltage $\Delta V_{k-1}$ is greater than the error criterion ε, that the high-frequency inverter is to lock to the current operating frequency $f_k$.

9. The wireless battery charging system of claim 7, wherein the feedback microcontroller is configured to update the operating frequency to compensate for a change in a coupling factor between the primary transformer and the secondary transformer by the generation of the updated operating frequency $f_{k+1}$.

10. The wireless battery charging system of claim 9, wherein the change in the coupling factor is due to one or more of:

a change in an alignment between the primary transformer and the secondary transformer;

a change in an orientation of the primary transformer and the secondary transformer; and a change in a distance between the primary transformer and the secondary transformer.

11. The wireless battery charging system of claim 7, wherein the feedback microcontroller is configured to update the current operating frequency $f_k$ to the updated operating frequency $f_{k+1}$ in order to maximize a power provided to the load.

12. A method for wireless power transfer to a rechargeable battery, comprising:

generating, by a frequency source, a first alternating current at a preset resonant frequency;

connecting a primary-side rectifier to the frequency source;

converting, by the primary-side rectifier, the first alternating current at the preset frequency to a direct current;

converting, by a high-frequency inverter connected in parallel with the first rectifier, the direct current to a second alternating current at an operating frequency; and connecting a primary transformer in parallel with the high-frequency inverter;

receiving, by the primary transformer, the second alternating current at the operating frequency;

generating, by the primary transformer, an alternating magnetic field at the operating frequency;

receiving, by a secondary transformer, the alternating magnetic field;

generating, by a secondary transformer, a stepped down alternating current at the operating frequency;

receiving, by a secondary-side rectifier connected in parallel with the secondary transformer, the stepped down alternating current at the operating frequency;

generating, by the secondary-side rectifier, a stepped down direct current;

connecting a load connected in parallel with the secondary-side rectifier;

receiving, by the load, the stepped down direct current;

measuring, by a voltage sensor connected to the load, a voltage $V_k$ at the load at the load;

determining, by a feedback microcontroller connected between the voltage sensor and the high-frequency inverter, a difference between a differential voltage $\Delta V_k$ and a delayed differential voltage $\Delta V_{k-1}$;

comparing, by the feedback microcontroller, an absolute value of the difference between the differential voltage $\Delta V_k$ and the delayed differential voltage $\Delta V_{k-1}$ to an error criterion ε;

determining, by the feedback microcontroller, a frequency step size based on the difference between the differential voltage $\Delta V_k$ and the delayed differential voltage $\Delta V_{k-1}$ when the absolute value of the difference between the differential voltage $\Delta V_k$ and the delayed differential voltage $\Delta V_{k-1}$ is less than the error criterion ε, updating, by the feedback microcontroller, the operating frequency with the frequency step size; and transmitting, by the feedback microcontroller, the updated operating frequency to the high-frequency inverter.

13. The method of claim 12, further comprising:

measuring, by the feedback microcontroller, the voltage $V_k$ at a first instant in time k.

14. The method of claim 13, further comprising:

connecting a first delay component to the voltage sensor;

generating, by the first delay component, a delayed voltage $V_{k-1}$; and connecting a positive input terminal of a subtractor to receive the voltage $V_k$ from the voltage sensor and connecting a negative input terminal configured to receive the delayed voltage $V_{k-1}$ from the first delay component; and generating, by the subtractor, a differential voltage $\Delta V_k$ given by $\Delta V_k = V_k - V_{k-1}$.

15. The method of claim 14, further comprising:

connecting a second delay component to the subtractor;

receiving, by the second delay component, the differential voltage $\Delta V_k$;

generating, by the second delay component, a delayed differential voltage $\Delta V_{k-1}$;

connecting a memory unit storing program instructions, the error criterion ε and a termination limit, to receive the differential voltage $\Delta V_k$ from the subtractor at a first input terminal and the delayed differential voltage $\Delta V_{k-1}$ at a second input terminal; and computing, by at least one processor configured to execute the program instructions, the absolute value of the of the difference between the differential voltage $\Delta V_k$ and the delayed differential voltage $\Delta V_{k-1}$.

16. The method of claim 15, further comprising:

determining, by the feedback microcontroller, the frequency step size of the updated operating frequency $f_{k+1}$ of the high-frequency inverter based on:

$$f_{k+1} = f_k - \left(\frac{\Delta V_k(f_k) - \Delta V_{k-1}(f_{k-1})}{f_k - f_{k-1}}\right)^{-1} \Delta V_k,$$

wherein $f_{k+1}$ is an operating frequency at instant in time k−1, $f_k$ is a current operating frequency and $f_{k+1}$ is the updated operating frequency at the instant in time k+1.

17. The method of claim 16, further comprising:

operating the high-frequency inverter at the updated operating frequency $f_{k+1}$ when the absolute value of the of the difference between the differential voltage $\Delta V_k$ and the delayed differential voltage $\Delta V_{k-1}$ is less than the error criterion ε; and locking the operating frequency at the current operating frequency $f_k$ when the absolute value of the of the difference between the differential voltage $\Delta V_k$ and the delayed differential voltage $\Delta V_{k-1}$ is greater than the error criterion ε.

18. The method of claim 16, further comprising:

compensating, by the feedback microcontroller, for a change in a coupling factor between the primary transformer and the secondary transformer by generating the updated operating frequency $f_{k+1}$.

19. The method of claim 16, further comprising:

generating the updated operating frequency $f_{k+1}$ to compensate for a change in a coupling factor between the primary transformer and the secondary transformer due to:

a change in an alignment between the primary transformer and the secondary transformer;

a change in an orientation of the primary transformer and the secondary transformer; and a change in a distance between the primary transformer and the secondary transformer.

20. The method of claim 16, further comprising:

maximizing, by the feedback microcontroller, a power provided to the load by updating the current operating frequency $f_k$ to the updated operating frequency $f_{k+1}$.

* * * * *